United States Patent
Connolly et al.

(10) Patent No.: US 9,287,681 B2
(45) Date of Patent: Mar. 15, 2016

(54) WAVELENGTH STABILIZED DIODE LASER

(71) Applicants: John C. Connolly, Clarksburg, NJ (US); Donald E Ackley, Cardiff, CA (US); Scott L. Rudder, Hopewell, NJ (US); Harald R. Guenther, Schnecksvile, PA (US)

(72) Inventors: John C. Connolly, Clarksburg, NJ (US); Donald E Ackley, Cardiff, CA (US); Scott L. Rudder, Hopewell, NJ (US); Harald R. Guenther, Schnecksvile, PA (US)

(73) Assignee: Innovative Photoic Solutions, Inc., Monmouth Junction, NJ (US)

( * ) Notice: Subject to any disclaimer, the term of this patent is extended or adjusted under 35 U.S.C. 154(b) by 45 days.

(21) Appl. No.: 14/094,790

(22) Filed: Dec. 3, 2013

(65) Prior Publication Data
US 2015/0131686 A1 May 14, 2015

Related U.S. Application Data

(60) Provisional application No. 61/903,942, filed on Nov. 13, 2013.

(51) Int. Cl.
| | |
|---|---|
| *H01S 5/14* | (2006.01) |
| *H01S 5/12* | (2006.01) |
| *H01S 3/08* | (2006.01) |
| *H01S 5/024* | (2006.01) |
(Continued)

(52) U.S. Cl.
CPC ... *H01S 5/14* (2013.01); *H01S 5/12* (2013.01); *H01S 5/141* (2013.01); *H01S 3/08027* (2013.01); *H01S 5/0287* (2013.01); *H01S 5/02438* (2013.01); *H01S 5/0654* (2013.01); *H01S 5/1039* (2013.01); *H01S 2301/02* (2013.01)

(58) Field of Classification Search
CPC ........... H01S 5/068; H01S 5/12; H01S 5/125; H01S 5/14; H01S 5/142; H01S 5/3403; H01S 3/1062; H01S 5/1021; H01S 5/1025; H01S 5/02438; H01S 5/0287; H01S 5/0654; H01S 5/1039; H01S 5/141; H01S 3/08027
See application file for complete search history.

(56) References Cited

U.S. PATENT DOCUMENTS

| | | |
|---|---|---|
| 4,785,454 A | 11/1988 | Olsson |
| 5,050,179 A | 9/1991 | Mooradian |

(Continued)

FOREIGN PATENT DOCUMENTS

| | | |
|---|---|---|
| WO | WO02/082599 | 10/2002 |
| WO | WO2005/062936 | 7/2005 |
| WO | WO2006/025849 | 3/2006 |

OTHER PUBLICATIONS

Kotelnikov, E., "High-Power Single-Mode InGAAsP/InP Laser Diodes for Pulsed Operation" Proc. of SPIE, vol. 8277 (2012).

(Continued)

*Primary Examiner* — Armando Rodriguez
(74) *Attorney, Agent, or Firm* — Law Office of Carl Giordano, PC

(57) ABSTRACT

A hybrid external cavity laser and a method for configuring the laser having a stabilized wavelength is disclosed. The laser comprises a semiconductor gain section and a volume Bragg grating, wherein a laser emission from the semiconductor gain section is based on a combination of a reflectivity of a front facet of the semiconductor gain section and a reflectivity of the volume Bragg grating and the reflectivity of the semiconductor gain section and the volume Bragg grating are insufficient by themselves to support the laser emission. The hybrid cavity laser further comprises an etalon that provides further wavelength stability.

18 Claims, 14 Drawing Sheets

(51) Int. Cl.
*H01S 5/028* (2006.01)
*H01S 5/065* (2006.01)
*H01S 5/10* (2006.01)

(56) References Cited

U.S. PATENT DOCUMENTS

| | | | |
|---|---|---|---|
| 5,327,447 | A | 7/1994 | Mooradian |
| 5,691,989 | A | 11/1997 | Rakuljic |
| 5,771,252 | A | 6/1998 | Lang |
| 6,141,360 | A * | 10/2000 | Kinugawa et al. .............. 372/20 |
| 6,205,159 | B1 | 3/2001 | Sesko |
| 6,282,215 | B1 | 8/2001 | Zorabedian |
| 6,941,043 | B1 | 9/2005 | Major |
| 7,031,573 | B2 | 4/2006 | Volodin |
| 7,125,632 | B2 | 10/2006 | Volodin |
| 7,177,340 | B2 | 2/2007 | Lang |
| 7,248,617 | B2 | 7/2007 | Volodin |
| 7,248,618 | B2 | 7/2007 | Volodin |
| 7,273,683 | B2 | 9/2007 | Volodin |
| 7,294,280 | B2 | 11/2007 | Sherrer |
| 7,298,771 | B2 | 11/2007 | Volodin |
| 7,397,837 | B2 | 7/2008 | Volodin |
| 7,477,818 | B2 | 1/2009 | Volodin |
| 7,528,385 | B2 | 5/2009 | Volodin |
| 7,545,844 | B2 | 6/2009 | Volodin |
| 7,567,608 | B2 | 7/2009 | Chung |
| 7,590,162 | B2 | 9/2009 | Volodin |
| 7,633,985 | B2 | 12/2009 | Volodin |
| 7,697,589 | B2 | 4/2010 | Volodin |
| 7,796,673 | B2 | 9/2010 | Volodin |
| 7,817,888 | B2 | 10/2010 | Volodin |
| 7,889,776 | B2 | 2/2011 | Charache |
| 7,949,216 | B2 | 5/2011 | Volodin |
| 8,306,088 | B2 | 11/2012 | Volodin |
| 2007/0127539 | A1 | 6/2007 | Wang |
| 2008/0187019 | A1* | 8/2008 | Chung ....................... 372/50.11 |

OTHER PUBLICATIONS

Volodin, B.L., etc. "Wavelength Stabilization and Spectrum Narrowing of High-Power Multiimode Laser Diodes . . . ", Optics Letters, V. 29, Aug. 15, 2004, pp. 1891-1893.
Glebov, L. B. "High Brightness Laser Design Based on Volume Bragg Gratings," Proc. of SPIE vol. 6216, 6221601 (2006).
Venusa, G. B. "High-Brightness Narrow-Line Laser Diode Soruce with Volume Bragg-Grating Feedback." Proc. of SPIE vol. 5711 (SPIE, Bellinghame Wa, 2005, pp. 166-176.
Hieta, T. "External-Cavity Laswers Based on a Volume Holographic Grating at Normal INcidence for Sepectroscopy in the Visible Range" Optics Communications 282 (2009) pp. 3119.
Venus, G. etc. "Spectal Stabilization of Laser Diodes by External Bragg Resonator," SSDLTR 2004-Poster 14 17th Solid Sate and Diode Laser Technology Review Proceedings.
Volodin, B.L., etc. "Holographic Volume Bragg Grating Stablized Laser Diode Perfomance" Photonics Spectra, Nov. 2003, pp. 68-73.
Koteninikov, E.J., "High Power Single Mode InGaAsP/InP Laser Diodes for Pulse Operation," Porc. of SPIE, vol. 8277, (2012).
Zorabedian, P., "Grating-Tunded External Ring Cavities." Tunable Lasers Handbook (Google eBook) Section 8.1.3, pp. 398-399 (Jan. 8, 1996).
Voumard, C., "External-Cavity-Controlled 32 MHz Narrow Band CW Ga A1 As-Diode Lasers," Opt. Lett 1977, Inst. of Applied Physics, University of Berne, Berne, Switzerland.

* cited by examiner

FIG. 2A Side View

FIG. 2B Top View

WAVELENGTH STABILIZED DIODE LASER

CLAIM OF PRIORITY

This application claims, pursuant to 35 USC 119, priority to, and the benefit of the earlier filing date of, that provisional patent application, entitled "Wavelength Stabilized Diode Laser," filed on Nov. 13, 2013 and afforded Ser. No. 61/903,942, the contents of which are incorporated by reference, herein.

FIELD OF THE INVENTION

This invention relates to the field of diode lasers and more particularly to a stable single mode operation of semiconductor diode lasers.

BACKGROUND OF THE INVENTION

Relative to other laser designs, diode lasers are more compact and robust, less expensive, electrically more efficient, radiate less waste heat, and easier to use as they do not require long warm-up times or great amounts of power (e.g., kilowatts) to operate. Overall, laser diodes offer a lower cost alternative for many applications. Until recently, however, diode lasers could not be used in products that require extremely high spectral stability and ultra-low wavelength drift due to strong temperature-dependence of the semiconductor material from which they are made. Single longitudinal mode diode lasers, such as distributed feedback (DFB) lasers, exhibit a temperature dependence of their optical emission wavelength of about 0.07 nm/° C. This temperature dependence alone makes the use of laser diodes difficult and costly in applications requiring a high degree of wavelength stability.

The use of volume holographic gratings, also termed VOLUME BRAGG GRATING (VBG), to stabilize the output wavelength of one or more diode lasers is known in the art as described, for example, in U.S. Pat. No. 7,889,776. VOLUME BRAGG GRATING and VBG are registered Trademarks of PD-LD Inc., Pennington, N.J.

FIGS. 1A and 1B represent side-view and top view, respectively, schematic illustrations of diode lasers of this type, often termed "hybrid external-cavity lasers" or HECLs in the art. In such lasers, a semiconductor gain section gain section, 110, provides optical gain. The optical radiation emitted from the semiconductor material (i.e., chip) diverges both perpendicular to and parallel to the epitaxial layer structure of the semiconductor gain section. The perpendicular direction is often termed the "fast axis", as the radiation pattern in that direction diverges at greater angles than the divergence in the parallel direction, often termed the "slow axis". Optics are used to collect and collimate the diverging beam. These optics are often termed a "fast axis corrector" (i.e., FAC), 120, and a "slow axis corrector" (i.e., SAC), 130. The FAC, 120, is typically located between the laser chip and the VBG, 140. The SAC, 130, may be located between the FAC 120 and VBG 140, as shown in FIGS. 1A and 1B. Alternatively, the SAC 130 may be located on the output side of the VBG (see for example FIGS. 2A and 2B, where the SAC 230 is on an output side of the VGB 240). FIGS. 2A and 2B represent side and top views, respectively of a HECL wherein the SAC is positions on the output side of the VRB. As the element of FIGS. 2A and 2B are substantially the same as those described with regard to FIGS. 1A and 1B, a detailed discussion of the elements of FIGS. 2A and 2B need not be further described.

Returning to FIGS. 1A and 1B, the reflectivity of the coating applied to the rear facet of the semiconductor gain section, $R_1$, 111, located at a position $z_1$ in FIG. 1, is high; typically 90-98% at the laser wavelength. The reflectivity of the front facet, $R_2$, 112, is typically several percent or more. For example, U.S. Pat. No. 7,298,771 teaches a self-seeded HECL where the gain section operates as a laser and where the reflectivity of a front facet, $R_2$, 112, may be in the range of 0.5-20% at the laser wavelength.

To a degree, a VBG-stabilized laser, shown in FIG. 1, may operate on a single longitudinal mode by using the VBG element as a partially reflective output coupler. The spectral reflectivity of the VBG element is substantially narrower than the width of the gain curve of the active medium of the laser. Only the longitudinal modes of the laser cavity with sufficient gain to exceed the lasing threshold will oscillate and be amplified. In some cases, the output of the laser module will consist of a single longitudinal mode.

In the conventional HECL shown in FIG. 1, the front and back surfaces of the collection/collimation optics, FAC and SAC, as well as the entrance and exit surfaces of the VBG 140 are anti-reflection coated so that the role of reflections from these surfaces does not contribute significantly to establishing optical cavities. The reflectivity of the wavelength selective feedback element (i.e., the volume Bragg grating of FIG. 1) is high relative to the reflectivity of the front facet of the gain chip, and thus a simplified analysis in which the front facet is ignored may be applied. In that case the functional optical cavity is established between the rear facet of the semiconductor gain section, at position $z_1$, and the effective position of the VBG, which is determined by the length of the VBG, the refractive-index variations of the VBG, and the periodicity of the contained Bragg grating. The optical cavity established by these reflections is shown as having a length $L_2$, 162, in FIG. 1, which defines a Fabry-Perot etalon. The spacing of transmission and reflection maxima produced by a Fabry-Perot etalon is:

$$\Delta v_C = \frac{c}{2 OPL} \quad (1)$$

where c is the speed of light in vacuum;
OPL is the optical path length.

OPL is determined by the summation of the physical path length, $L_i$, multiplied by the effective refractive-index, $\eta_i$, of each segment of the optical path.

In the HECL shown in FIG. 1, the semiconductor gain section having a physical length of 1.5 mm (millimeter) and a refractive index of approximately 3.5 (at a wavelength, $\lambda_0$ of 1.064 µm), the effective length of the VBG may be approximately 1.5 mm with a refractive-index of approximately 1.5; the total thickness of the FAC and SAC may be approximately 2 mm with a refractive-index of approximately 1.5; and the total effective physical length of the Fabry-Perot cavity may be approximately 10 mm. The OPL is then approximately 15.5 mm, as shown in Table 1.

TABLE 1

|  | $L_i$ (mm) | $\eta_i$ | $\eta_i L_i$ (mm) |
| --- | --- | --- | --- |
| Gain section | 1.5 | 3.5 | 5.25 |
| FAC + SAC | 2.0 | 1.5 | 3.00 |
| VBG | 1.5 | 1.5 | 2.25 |
| Free space | 5.0 | 1.0 | 5.00 |
| OPL |  |  | 15.50 |

The free spectral range of such a cavity, given by Eq. 1, is $\Delta v_C$ approximately 9.7 GHz, or $\Delta\lambda C$ approximately 37 pm (picometers) at $\lambda_0=1.064$ μm (micrometers).

The principle by which a conventional HECL operates is illustrated in FIG. 3.

As shown in FIG. 3, the semiconductor gain section, 110 (of FIG. 1A, 1B) has a gain profile, 310 that is broad. Typically, the full-width at half-maximum of the gain profile (i.e., 3 db points) can be 30 nm (nanometers) or greater.

The laser cavity formed by $R_1$, 111, and the VGB, 140, having a length of $L_2$, 162, in FIGS. 1A, 1B supports many modes, indicated by the set of discrete modes 360 of FIG. 3. In conventional practice, the HECL is configured so that only one mode, 361, of the set of discrete modes 360, is at a wavelength for which the diode chip gain exceeds a lasing threshold, 365; such that a lasing output is achieved. The HECL will, preferentially, operate on that cavity mode. That is generate a lasing output at wavelength $\lambda_0$.

Also shown in FIG. 3 is the spectral reflection profile, 340, of the VBG, 140 (of FIG. 1A). Although the spectral reflection profile, 340, of the VBG gain profile is shown as centered with respect to the gain profile 310, it will be appreciated that the spectral reflection profile, 340, of the VBG gain profile does not need to be centered with respect to the gain profile, 310, of the laser chip. Generally the VBG profile is often offset with respect to the laser chip profile. The width of the spectral profile of the VBG, $\Delta\lambda_{VBG}$, 341, is considerably narrower than that of the diode laser gain profile, 310, and can be determined by the number of Bragg grating planes, N, formed in the VBG:

$$\Delta\lambda_{VBG}/\lambda_0 \approx N \quad (2)$$

In a VBG having a length of approximately 3 mm, with Bragg grating planes spaced by $\lambda_0/2n$, where n is the refractive-index of the material, N may be of the order of 104, at $\lambda_0=1.064$ μm. Thus, $\Delta\lambda_{VBG}$ is approximately 100 pm.

A Fabry-Perot resonator such as that formed by the $R_1$, 111, and the VBG 140 may be further characterized by peaks in the transmission which correspond to cavity resonances within the etalon, and hence the allowed lasing modes of the cavity. A description of the transmission of light through a Fabry-Perot etalon is schematically depicted in FIG. 4 as curve 450. The transmission of light, T, can be expressed by:

$$T = \frac{(1-\sqrt{R_1 R_2})^2}{1+R_1 R_2 - 2\sqrt{R_1 R_2}\cos\left(\frac{4\pi nL}{\lambda}\right)} \quad (3)$$

where
  n is the refractive index of the medium
  L is the path length,
  λ is the wavelength of light,
  $R_1$ is the reflectivity of the rear facet of the resonant cavity, and
  $R_2$, in this case, may represent $R_{VBG}$.

An exemplary HECL operating at λ=1.064 μm, with the laser chip having a rear reflectivity $R_1$ of approximately 0.9 may have a VBG with a length of 3 mm and a reflectivity, $R_{VBG}$ approximately equal to 0.3. For the purposes of this simplified calculation, n=1, and L=15.5 mm. The resultant Fabry-Perot etalon has a finesse, i.e. a ratio of the free spectral range, $\Delta\lambda_C$, to the full-width at half-maximum of the spectral distance between resonance, of approximately 4.8.

Referring to FIG. 4, a subset of the set of resonant wavelengths of the Fabry-Perot etalon is denoted as 460. The set of cavity resonances arising from reflections from $R_1$ and the VBG now are depicted as having finite width, and are shown as the shape 460 in FIG. 4. Superposed on the cavity resonances 460 is the spectral profile 441 of the emission reflected from the VBG, which is sufficiently narrow relative to the spacing of the cavity resonances so that only one cavity mode, 461, exceeds the gain threshold for lasing. The HECL will, therefore, oscillate at the wavelength of that cavity mode, $\lambda_0$, 470.

Such operation, however, is not stable with respect to minor variations in operating parameters, such as variations in laser power, the temperature of the VBG, and thermal expansion of the optical cavity. In addition, instabilities often result from laser emission from the semiconductor gain section acting as a laser on its own. In the prior art disclosed here, HECL systems with VBGs are designed such that the semiconductor gain section is a laser. For example, in U.S. Pat. No. 7,298,771 the use of a laser diode in conjunction with a VBG, such that the reflected light from the VBG only causes a narrowing of the emission spectrum of the laser diode. This design has significant shortcomings, however, as the laser diode is operating without any reflected light from the VBG. The reflectivity from the Bragg grating simply narrows the existing laser emission. Thus, as the laser diode drive is varied to vary the output of the diode, instabilities may be introduced due to variations in spatial modes and gain saturation, leading to mode hops and linewidth broadening. The devices can even operate such that emission from the lasing of the semiconductor cavity occurs simultaneously with emission from the cavity formed by the VBG. An example of this mode of operation may be found in E Kotelnikov et al, Proc. of SPIE Vol. 8277, 2012. Similar effects can occur due to temperature variations.

The basic principles of operation of VBG-stabilized HECLs as described in the prior art are insufficient to guarantee single-longitudinal mode operation. In fact, relatively small values of the front-facet reflectivity, $R_2$ (112 in FIG. 1A), result in resonances in the semiconductor gain section defined by its own Fabry-Perot cavity, independent of the HECL cavity formed by the VBG element. The value of $R_2$ at which such self-oscillation occurs depends on the gain of the semiconductor gain section (and the value of $R_1$), and can occur even at a reflectivity of a few percent or less. Furthermore, laser oscillation on multiple modes of the HECL cavity have been observed even when the value of $R_2$ is as low as 0.5% for devices with long gain sections at high drive current. In such cases, the laser mode hops between allowed modes oscillating at different wavelengths (i.e., wavelength hopping).

Hence, a hybrid external cavity laser that provides substantially increased stability and reduced linewidth of generated laser light is needed in the industry.

SUMMARY OF THE INVENTION

Briefly, to achieve the desired objects of the present invention in accordance with a preferred embodiment, disclosed is a hybrid external cavity laser with enhanced wavelength stability. The hybrid external cavity laser utilizes a VBG as a reflector and output coupler, with specific reflectivity optimized to enhance wavelength stability of the device. In conjunction with a semiconductor gain section which also has specific reflectivities, multiple cavities are formed within the hybrid external cavity laser device. Only when the resonances of the multiple cavities are aligned does the device act as a laser, assuring stable single mode operation. Wavelength stability is further enhanced by adjusting the reflectance profile of the VBG so that its peak substantially coincides with resonance peaks of the multiple cavities formed within the device. The resonances are aligned by adjusting the position of the VBG and/or the temperature of the individual cavities. As the VBG is fabricated in glass, which has a low thermal coefficient of expansion, the properties of the Bragg grating are quite stable with temperature. In addition, the optical components are mounted on a low coefficient of expansion platform, typically formed from silicon or ceramic. Thus the external cavity length is stable with temperature, further improving the wavelength stability of the device described herein. These factors combine to form a hybrid external cavity laser that operates in a single mode with narrow linewidth and exceptional wavelength stability, even at high output powers.

The devices and methods disclosed herein differ from prior art related to external cavity wavelength stabilized semiconductor lasers in that the prior art uses a semiconductor laser and an external cavity that provides a wavelength narrowing seed to force the semiconductor laser to oscillate at a specific wavelength; i.e., the semiconductor laser component is injection-locked. The instant invention uses a semiconductor gain section that, through the choice of gain section length and facet reflectivity, cannot lase on its own without the feedback provided by the VBG. Additionally, the reflectivity of the VBG is chosen such that feedback from the grating is insufficient on its own to support operation of the HECL device. Thus the HECL device can only operate when the feedback from the front facet of the semiconductor gain section and the feedback from the VBG resonantly combine to support laser operation of the device. This ensures that the wavelength-stabilized laser of this disclosure can oscillate only at wavelengths defined by the coincidence of modes allowed by the external cavities and the reflection profile of the VBG. Single wavelength operation with narrow linewidths and exceptional stability is observed.

The objects and other aspects of the invention are further achieved by choosing the specific reflectivities of the VBG and facets of the semiconductor gain section so as to maximize the wavelength stabilization while minimizing the potential for lasing of the semiconductor gain section on its own, which would serve to de-stabilize the device. Additionally, the length and unit gain of the gain section may be adjusted in conjunction with the reflectivities of the gain section and the VBG to provide maximum device performance.

The objects and other aspects of the invention are further achieved by incorporating a Fabry-Perot etalon within the device to act as a narrow linewidth filter, to provide additional wavelength stability. The etalon is tilted to prevent non-resonant reflected emission from its surfaces from reflecting into the semiconductor gain section and destabilizing the device.

BRIEF DESCRIPTION OF THE DRAWINGS

For a better understanding of exemplary embodiments and to show how the same may be carried into effect, reference is made to the accompanying drawings. It is stressed that the particulars shown are by way of example only and for purposes of illustrative discussion of the preferred embodiments of the present disclosure, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice. In the accompanying drawings.

It is to be understood that the figures and descriptions of the present invention described herein have been simplified to illustrate the elements that are relevant for a clear understanding of the present invention, while eliminating, for purposes of clarity only, many other elements. However, because those eliminated elements are well-known in the art, and because they do not facilitate a better understanding of the present invention, a discussion of such elements or the depiction of such elements is not provided herein. The disclosure herein is directed also to variations and modifications known to those skilled in the art.

DESCRIPTION OF THE INVENTION

Stable single-longitudinal mode operation of a HECL laser has been achieved by utilizing a semiconductor gain section in which lasing is prevented by choosing a combination of low front facet reflectivity and cavity length such that the semiconductor gain is insufficient to offset the loss of light through the low reflectivity front facet. That is, without feedback from the VBG, the semiconductor gain section operates in a non-lasing mode (i.e., superluminescent diode). In addition, the reflectivity of the VBG is chosen such that the HECL laser also will not lase in the absence of some feedback from the front facet of the semiconductor gain section. Thus, in order for the HECL to operate as a laser, the reflected emission from both the front facet and VBG must resonantly combine to reach lasing threshold. This leads to stable single longitudinal mode operation of the HECL embodied herein.

Figure 4:
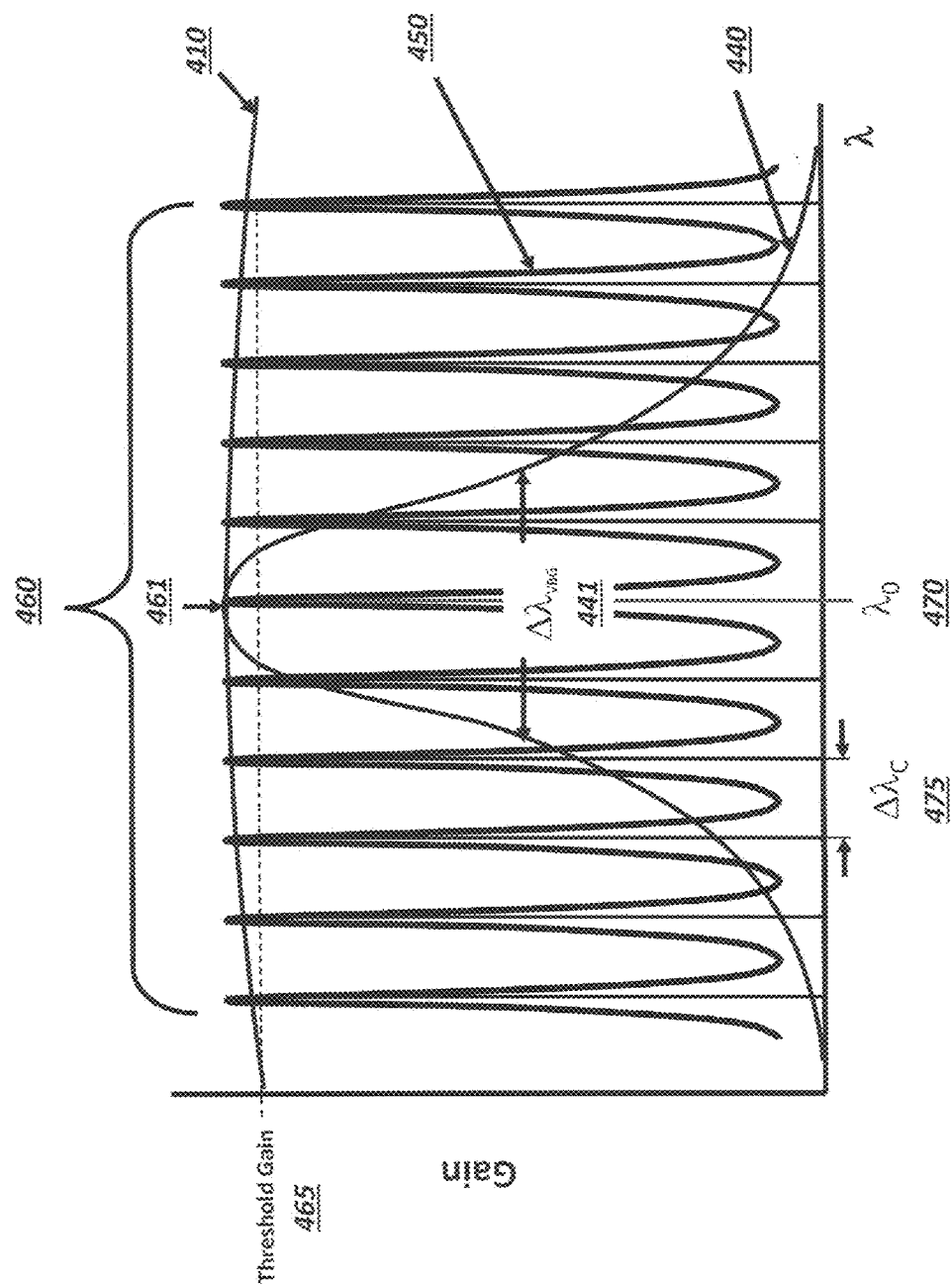
FIG. 4 illustrates an exemplary cavity resonances and threshold gain for a semiconductor gain section.

To achieve the necessary resonance of the reflected emissions, the resonant frequencies of the Fabry-Perot cavities formed by the front and rear facets of the semiconductor gain section, and by the rear facet of the semiconductor gain section and VBG, must align. Using the exemplary parameters of Table 1, the free-spectral range of the semiconductor gain section itself, $\Delta\lambda_G$ is approximately 104 pm. Thus, the combined effect of the semiconductor gain section gain curve and diode laser Fabry-Perot cavity may be approximated by cavity resonances of Eq. 4, determined using a semiconductor gain section length, L, of 1.5 mm and a refractive-index of 3.5, with a rear facet reflectivity of 90% and a front facet reflectivity of 0.2%. The laser chip gain curve, 410 (of FIG. 4) is sufficiently broad compared to the other relevant spectral features that it may be approximated as being of constant magnitude over the wavelength range of interest, i.e., the width of the spectral profile of the VBG reflection, $\Delta\lambda_{VBG}$, 441 (of FIG. 4), which is of the order of 100 pm in width. The transmission function, T, is approximately sinusoidal and varies between a maximum of 1.00 (as is the case for all Fabry-Perot etalons operating on a resonance) and approximately 90%, as shown as curve 580 in FIG. 5.

Figure 5:
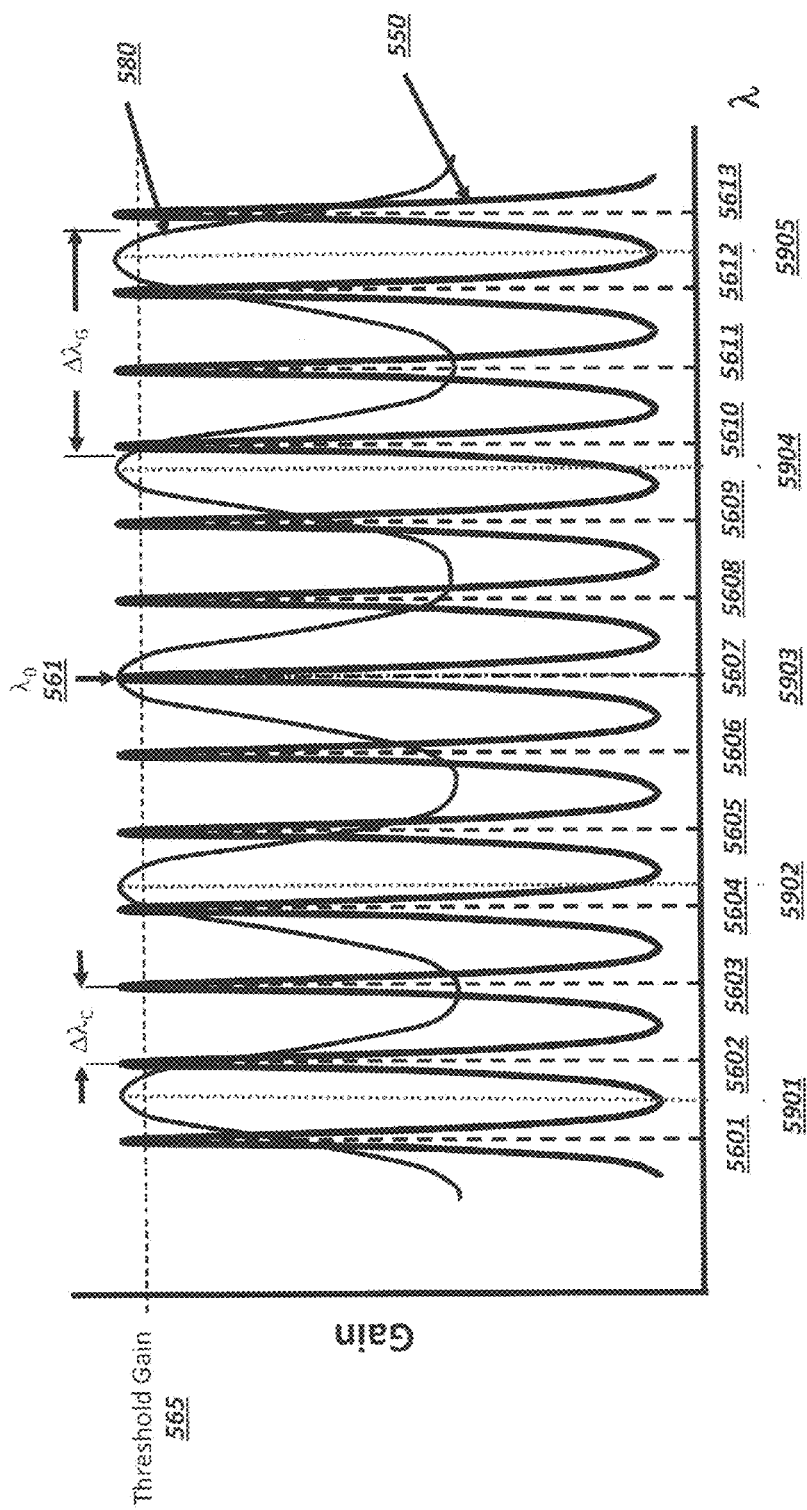
FIG. 5 illustrates an exemplary superposition of cavity resonances of sub-cavities formed by the rear reflector-VBG and the semiconductor gain section.

FIG. 5 shows the cavity resonances of both the VBG cavity, 550, and the semiconductor gain section, 580, when the semiconductor gain section has sufficient front-facet reflectivity to support resonant modes. The resonances of the VBG cavity 550 and the semiconductor gain section cavity 580 are separated in wavelength by $\Delta\lambda_C$ and $\Delta\lambda_G$, respectively. As stated above, for the exemplary case shown in Table 1, $\Delta\lambda_C$ is approximately 37 pm and $\Delta\lambda_G$, is approximately 104 pm. The resonant wavelengths of subsets of the two sets of modes are shown as the vertical lines in the figure. Resonant wavelengths 5601-5613 correspond to the resonance peaks for the VBG cavity, 550. Resonant wavelengths 5901-5905 correspond to the peaks for the semiconductor gain section cavity, 580.

In this example, the separation between semiconductor gain section resonant wavelengths, $\Delta\lambda_G$, is slightly less than three times that of the separation between HECL cavity resonant wavelengths, $\Delta\lambda_C$; i.e., 104 pm versus (3×37=111 pm). Thus, the only coincidence between the two sets of allowed modes shown in FIG. 5 for which the combined transmission functions exceeds the threshold gain of the semiconductor gain section occurs at the wavelength of modes 5607 and 5903, respectively. Therefore, the HECL will oscillate at this wavelength, shown as $\lambda_G$, 561.

The gain spectrum of the semiconductor gain section, 410 (of FIG. 4), is broad on the scale shown in FIG. 5 and may be, therefore, considered to be constant. Also, note that the coincidence between modes 5607 and 5903 at, wavelength 561 in FIG. 5 is arbitrarily chosen for illustrative purposes. However, many instances of overlap of the transmission curves 550 and 580 will occur, some of which may exceed lasing threshold. For example, in FIG. 5 modes 5602, 5604, and 5610 are substantially coincident with peaks in the transmission curves 580 (peaks 5901, 5902, and 5904, respectively) and may be seen to be close to threshold gain as well. This. These substantially close coincidence could potentially exceed threshold under some operating conditions; leading to wavelength instabilities in the operation of the device.

Figure 6:
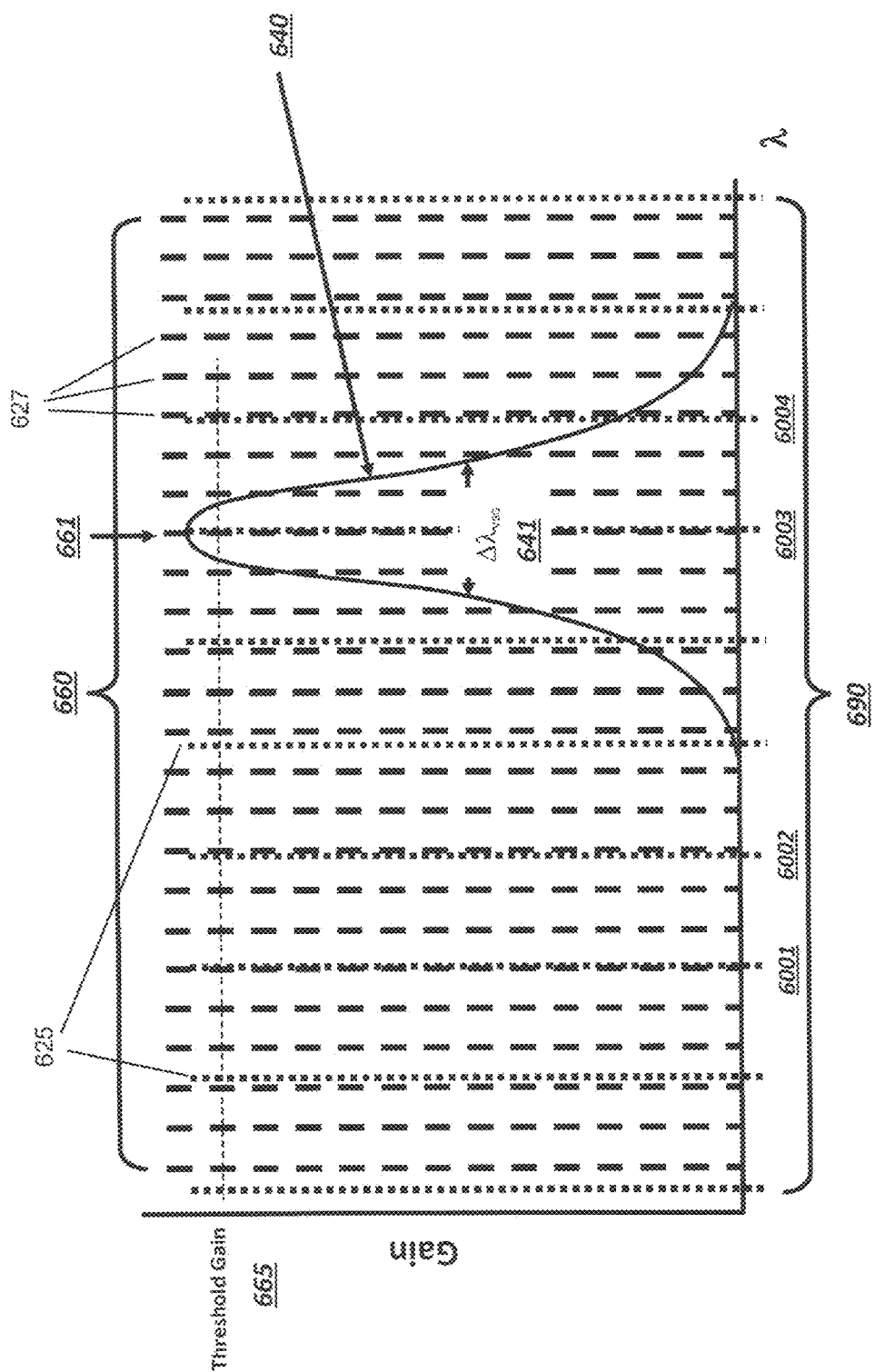
FIG. 6 illustrates an exemplary superposition of subsets of resonant modes of a HECL cavity and a semiconductor gain section and reflection profile of the VBG element, allowing selection of a single laser mode in accordance with the principles of the invention.

A particular coincidence (i.e., mode) may be selected by tuning a center wavelength of the reflection profile of the VBG element, as shown in FIG. 6, which shows only the center wavelengths of the peaks of the allowed modes. In this exemplary example, the dashed vertical lines, 627, represent the center wavelengths of the resonant modes of the cavity forced by the VBG and rear facet of the semiconductor gain section while the dotted vertical lines 625 represent the center wavelengths of the resonant modes of the cavity formed by the front and rear facet of the semiconductor gain section.

FIG. 6 shows the VBG reflection profile, 640, superimposed on two sets of resonant cavity wavelengths, 5601-5613 and, 5901-5905, corresponding to the HECL and diode laser cavity modes, respectively, shown in FIG. 5.

In FIG. 6, the reflection profile of the VBG element, however, is shown tuned such that the substantially coincident modes at wavelength 5602, 5604, and 5610 of FIG. 5 are not reflected sufficiently by the VBG to exceed lasing threshold. The nearly substantially coincident modes at 5607 is sufficiently reflected such that the laser will oscillate only at $\lambda_G$, 661 (which is comparable to wavelength 561 of FIG. 5).

The resultant overlap of the resonant modes of the gain section and VBG sub-cavities and the reflection profile of the VBG leads to strong discrimination in favor of the mode 5607 (operating at wavelength at 561), as shown in FIG. 5, and allows stable operation of the HECL device over a wide range of operating conditions.

In one aspect of the invention, tuning of the center wavelength of the VBG reflection profile may be achieved, for example, by varying the temperature of the VBG. Typically in an HECL device, the entire cavity is mounted in a stable, temperature controlled package, enabling both stable operation and the ability to vary the temperature of the components of the HECL device. VBGs are often fabricated by creating parallel planes of higher and lower refractive index in a photosensitive optical material, such as a glass. BK7 is a representative glass host used to fabricate VBG elements. The coefficient of thermal expansion of BK7 is approximately $7\times10^{-6}/°$ C. and the index-of-refraction, $\eta$, is approximately 1.5. Thus, for example, at $\lambda_0=1.064$ µm, Bragg grating planes are separated by $\lambda_0/2\eta$, or approximately 355 nm. The change of wavelength within the VBG as a function of temperature is approximately 2.5 pm/° C.; in air, this is 7.5 pm/° C. Thus, varying the temperature of the VBG by a few degrees can easily move the center of its reflection profile substantially more than the separation between HECL cavity modes.

Figure 1:
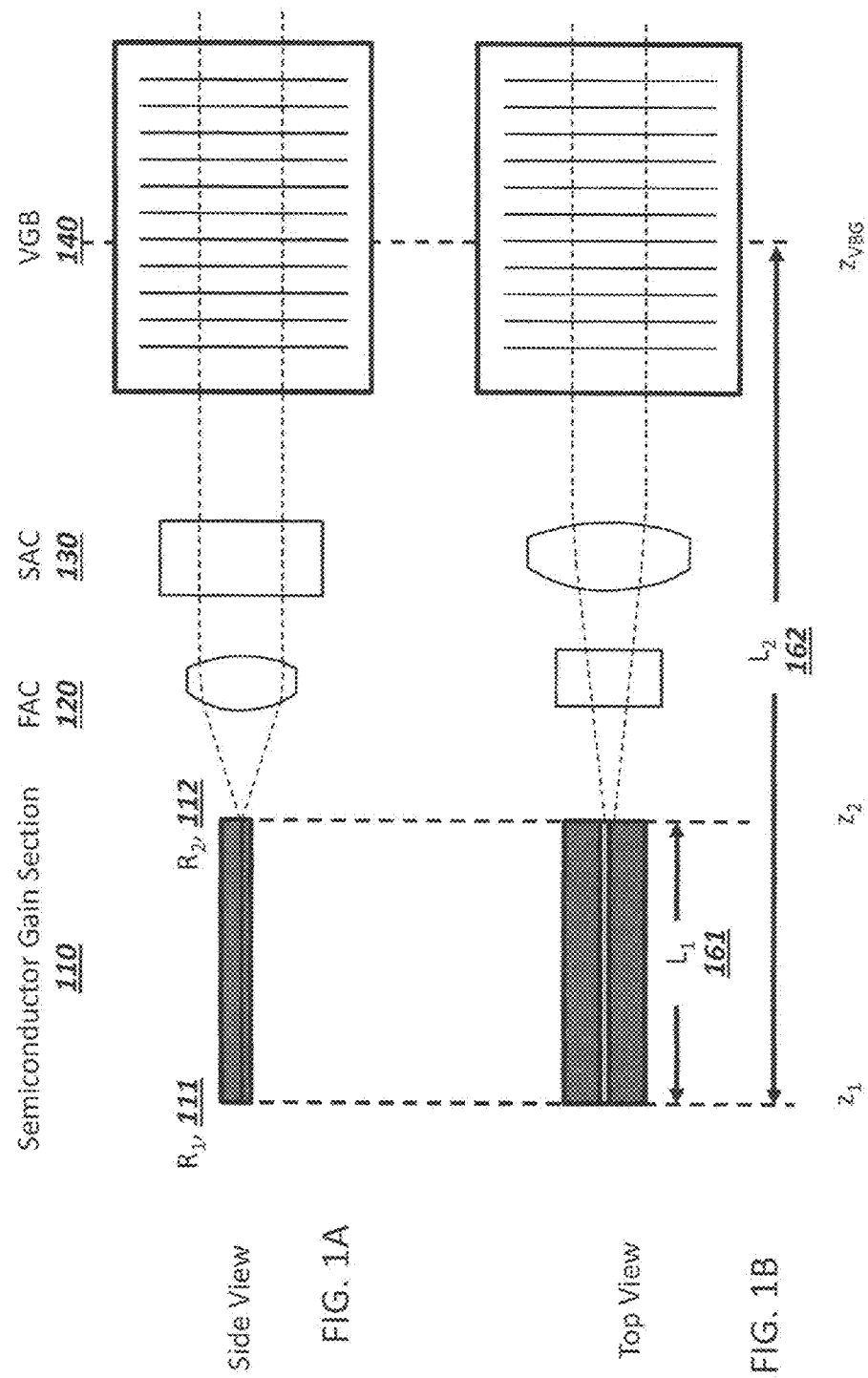
FIGS. 1A and 1B illustrate side and top views, respectively, of a conventional hybrid external cavity laser (HECL).
Figure 2:
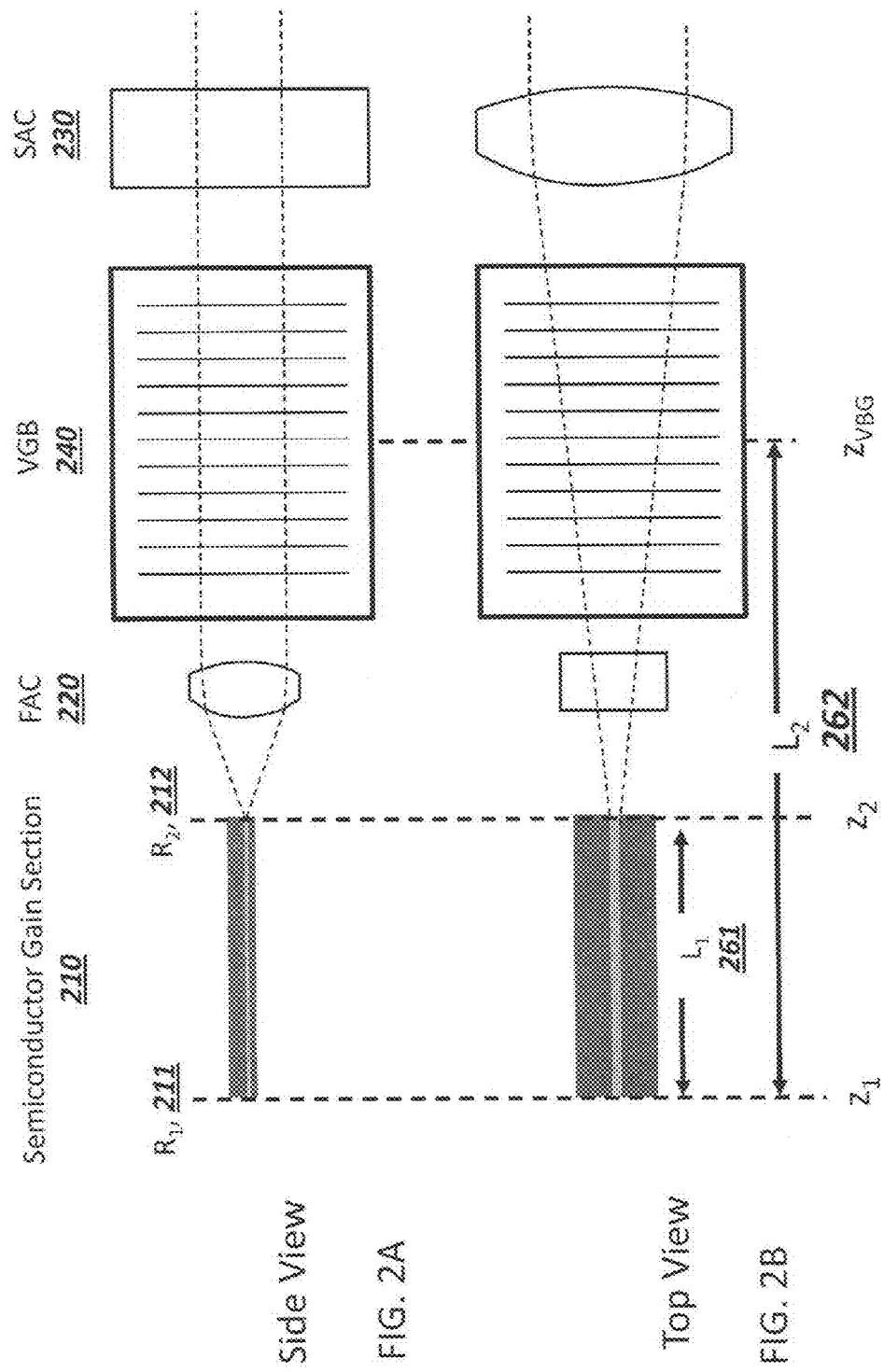
FIGS. 2A and 2B illustrate side and top views, respectively, of another embodiment of a conventional HECL.
Figure 3:
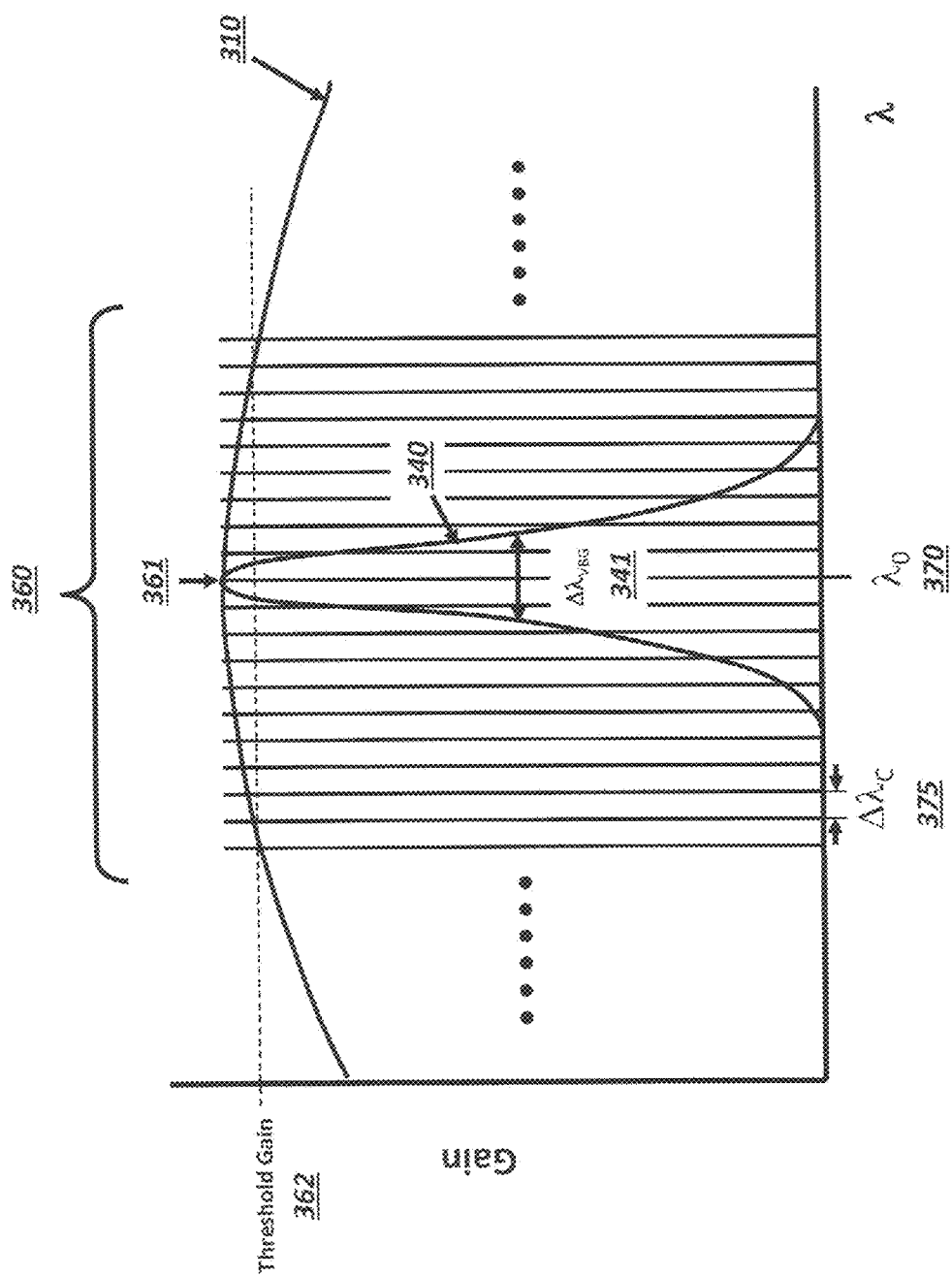
FIG. 3 illustrates a reflection spectrum due to VBG and Fabry-Perot resonances formed by the rear facet of the semiconductor gain section and VBG.

Tuning of the free spectral range of the HECL may also be achieved by positioning the VBG with respect to the rear-facet reflector of the semiconductor gain section. Changing the length of this cavity, shown as $L_2$ (162 of FIG. 1A) alters $\Delta v_C$ as described by Eq. 1.

Referring to Table 1, the free-spectral range of cavity of a HECL configured in such a fashion is $\Delta v_C$ approximately 9.7 GHz, or $\Delta\lambda_C$ approximately 37 pm at $\lambda_0=1.064$ µm. Decreasing the path length between the optical components from 5.00 mm to 4.00 mm, for example, changes the total optical path length (OPL) to 14.50 mm and, commensurately, the free spectral range of the HECL cavity to $\Delta v_C$ approximately 10.3 GHz, or $\Delta\lambda_C$ approximately 39 pm, forming a different comb of allowed cavity modes that will have different coincidences with the allowed cavity modes of the semiconductor gain section.

Figure 7:
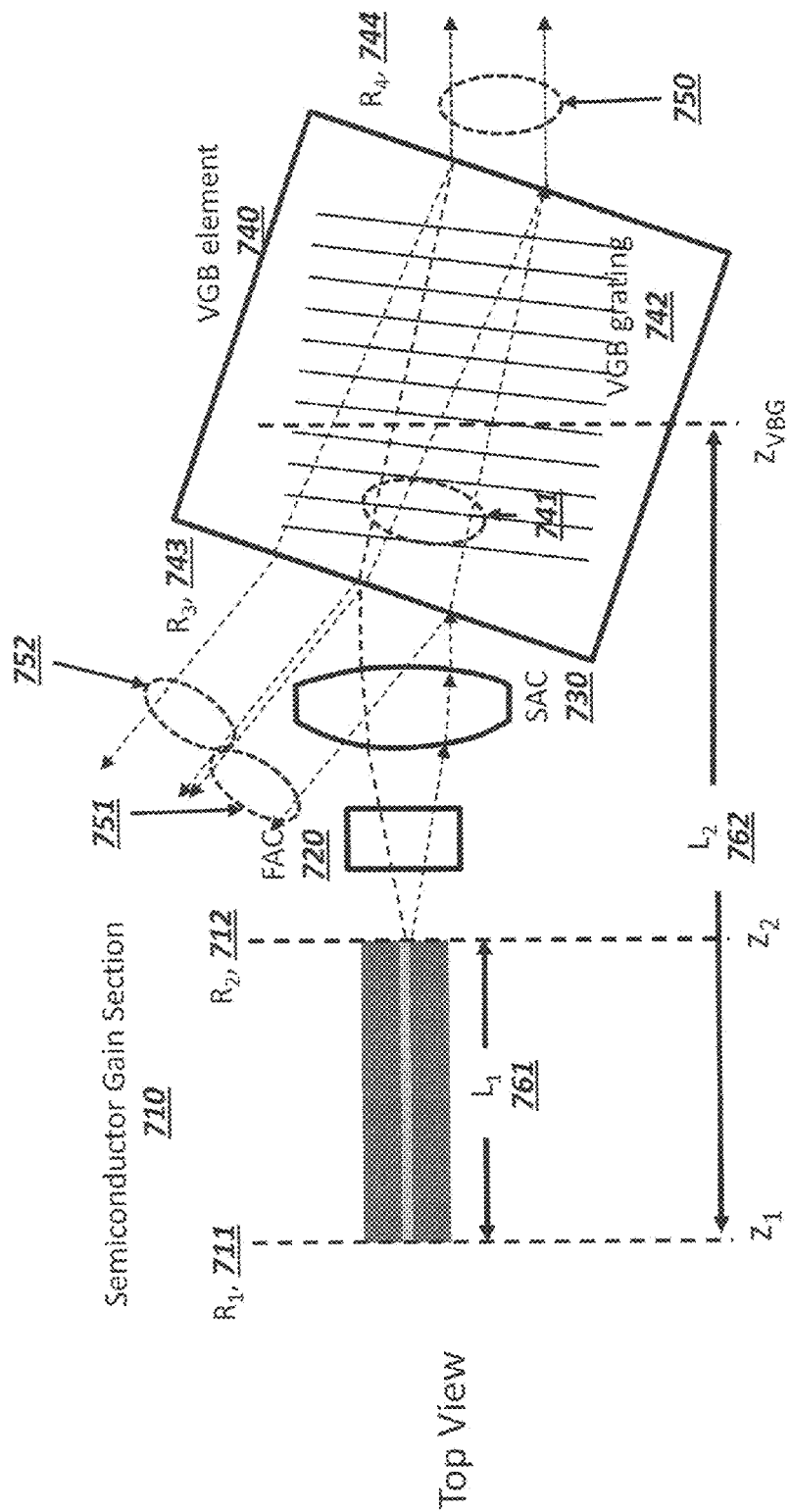
FIG. 7 illustrates a top view of an exemplary configuration of an embodiment of a HECL in accordance with the principles of the invention.

In practice, it is important to reduce reflections from the front and rear surfaces of the VBG element back into the semiconductor gain section to levels as low as possible to avoid creating yet additional Fabry-Perot cavities. As schematically illustrated in FIG. 7, the VBG element, 740, is tilted to skew front-facet reflections, 751, and rear-facet reflections, 752, from the front facet are shown in the figure for purposes of clarity, thereby substantially reducing the amount of light fed back into the semiconductor gain section. In addition, the reflectivity of the front and rear surfaces of the VBG element, $R_3$, 741, and $R_4$, 742, have anti-reflection coatings applied to reduce reflections even further. The output laser beam, 750, of the HECL is shown as being emitted to the right of the VBG element, 740. In order to maximize feedback from the VBG grating, 742, back into the waveguide of the semiconductor gain section, the grating, 742, is preferably oriented substantially perpendicular to the optical beam, 741, passing through it. If the grating is tilted with respect to the optical beam, 741, the reflection would follow a different path through the collimating optics and not be incident on the waveguide of the semiconductor gain section, 710. As a result, this portion of the reflected light would not contribute to stabilizing the laser. Although FIG. 7 illustrates the VBG element 740 are positioned tilted with regard to the gain material 710, it would be recognized that the VBG may be in-line with the optical output of the gain material 710 and the facets of the VBG 740 may be tilted or oriented at an angle to the optical output of the gain material.

In another embodiment of the invention, the semiconductor gain section length, L1, 761, is reduced to increase the separation between Fabry-Perot modes allowed by that cavity, thereby increasing the inherent stability of the laser output wavelength. This configuration is possible because, for many applications, the HECL laser is used to seed a more powerful optical amplifier or laser, e.g., a fiber laser, which provides more than sufficient amplification to produce the optical power required.

For constant reflectivities $R_1$, $R_2$, and $R_{VBG}$, it is necessary for the semiconductor gain chip to produce more gain as its length is reduced. Techniques for increasing the gain are well known in the art and, for a commonly used quantum well gain section, include increasing the number of quantum wells in quantum well (QW) devices, epitaxially growing QW layers with built-in compressive or tensile strain, and epitaxially growing layer structures which have increased optical confinement.

Using these techniques, cavity lengths of 1 mm, 500 µm, or even shorter have often been used to fabricate diode lasers. Table 2 shows an exemplary configuration in which the semiconductor gain section is 500 µm and the total HECL cavity length is 12 mm. The SAC element, 730, in this case is positioned on the input side of the VBG element, 740.

TABLE 2

|  | $L_i$ (mm) | $\eta_i$ | $\eta_i L_i$ (mm) |
|---|---|---|---|
| Semiconductor gain section | 0.5 | 3.5 | 1.75 |
| FAC | 1.0 | 1.5 | 1.50 |
| VBG | 1.5 | 1.5 | 2.25 |
| Free space | 6.0 | 1.0 | 7.50 |
| OPL |  |  | 12.00 |

Figure 8:
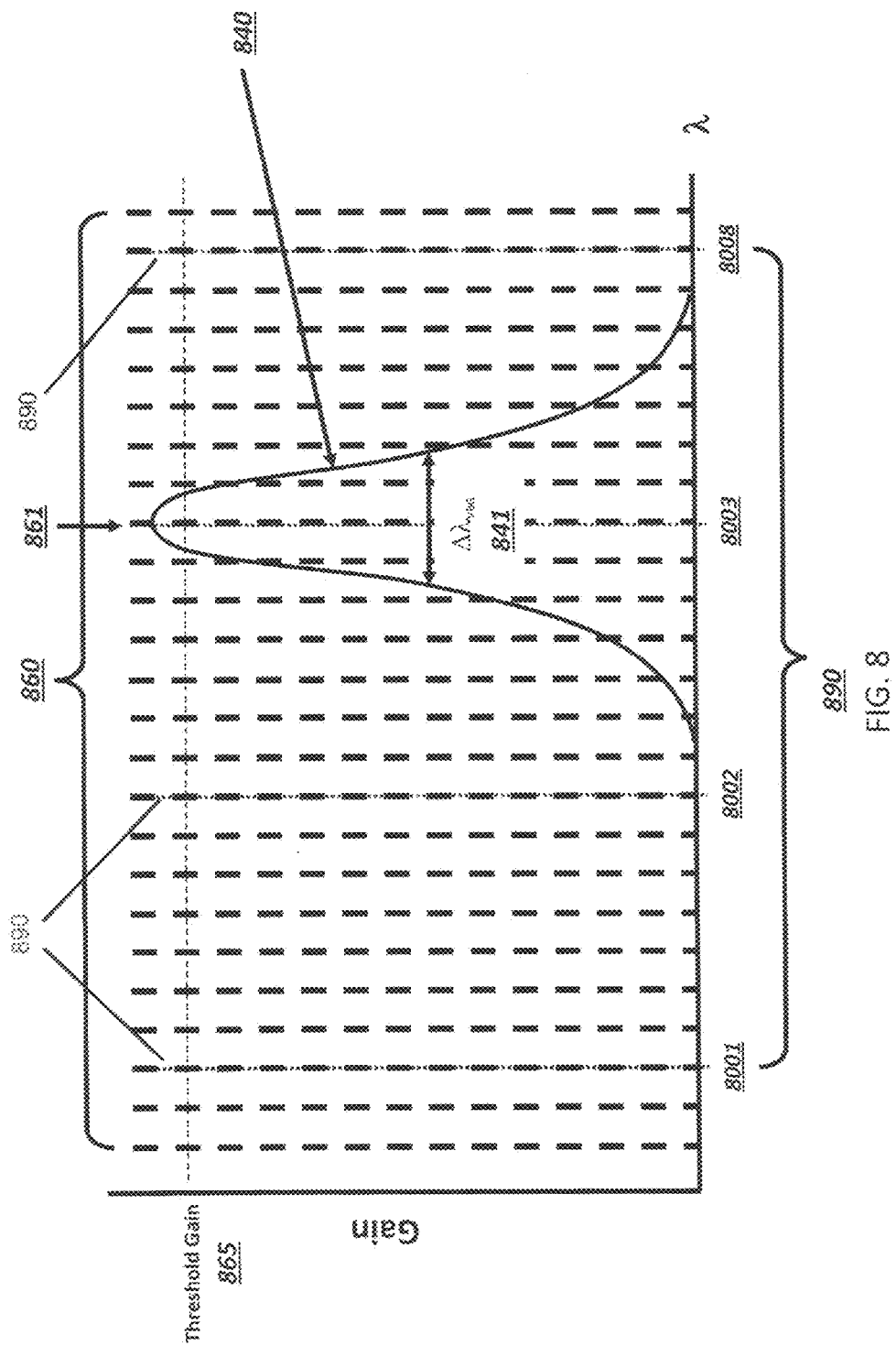
FIG. 8 illustrates an exemplary depiction of widely separated semiconductor gain section cavity modes compared to HECL cavity modes and the width of the VBG reflection profile in accordance with the principles of the invention.

The free-spectral range of such a 500 µm-long semiconductor gain section cavity is $\Delta v_G$ approximately 85.7 GHz or $\Delta \lambda_G$ approximately 323 pm at $\lambda_0 = 1.064$ µm. The OPL of the entire HECL cavity of 12.00 mm yields a free-spectral range of $\Delta v_C$ approximately 12.5 GHz or $\Delta \lambda_G$ approximately 47 pm. Thus, a coincidence between the resonances of the two cavities (i.e., semiconductor gain material cavity and VBG cavity) occurs approximately every seventh diode laser mode. This set of modes is schematically illustrated in FIG. 8.

In the exemplary laser of FIG. 7, coincidences between allowed Fabry-Perot modes of the semiconductor gain section, 890, shown as dotted thin vertical lines superimposed on allowed HECL cavity modes, 860, shown as dashed vertical lines, occur at wavelengths labeled 8001, 8002, 8003, and 8004, with only the mode operating at wavelength 8003 occurring within the reflection profile, 840, of the VBG element. Thus, only that mode, at wavelength 861 will oscillate independent of the value of the reflectivity of the front-facet of the semiconductor gain section, $R_2$. This condition applies even when the laser is operating well above the threshold gain.

Figure 9:
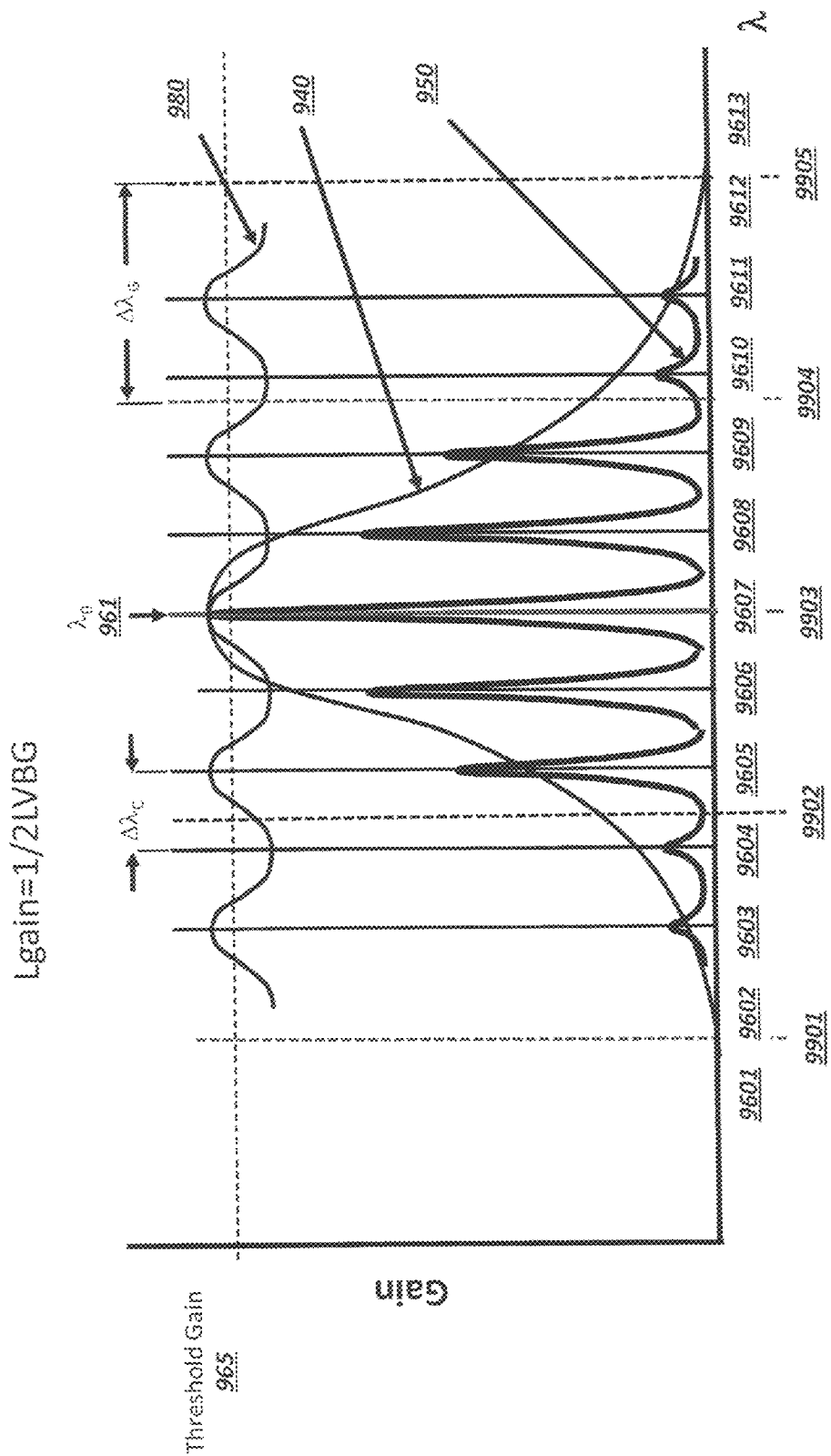
FIG. 9 illustrates an exemplary depiction of the modes arising when the optical length of the semiconductor gain section is chosen to be one-half the optical length of the VBG cavity in accordance with the principles of the invention.

In yet another embodiment of the invention the optical length of the semiconductor gain section is chosen to be one-half (½) the optical length of the VBG cavity. As shown in FIG. 9, this places the wavelengths of the minima of the resonant reflectances of the Fabry-Perot cavity formed by the semiconductor gain section (e.g., 9604, 9606, 9608) at wavelengths where alternate resonances of the VBG cavity occur. For a narrow linewidth spectral profile of the VBG, 940, this combination of the VBG reflectance profile, 940, the transmission spectrum of the semiconductor gain section cavity, 980, and the transmission spectrum of the VBG cavity, leads to reduced reflectance for modes other than peak lasing mode at wavelength 961 and enhances wavelength stability.

In order to optimize the wavelength stability of the optical emission, it is important to optimize the reflectivities $R_2$ and $R_{VBG}$ so that both resonant cavities participate in the mode selection process, while suppressing laser action within the semiconductor resonator. For substantially coincident modes selected by the overlap of the sub-cavity resonances and the VBG gain profile, a simple round-trip gain analysis may be used to determine the desired reflectivities.

Figures 10, 10A, 10B:
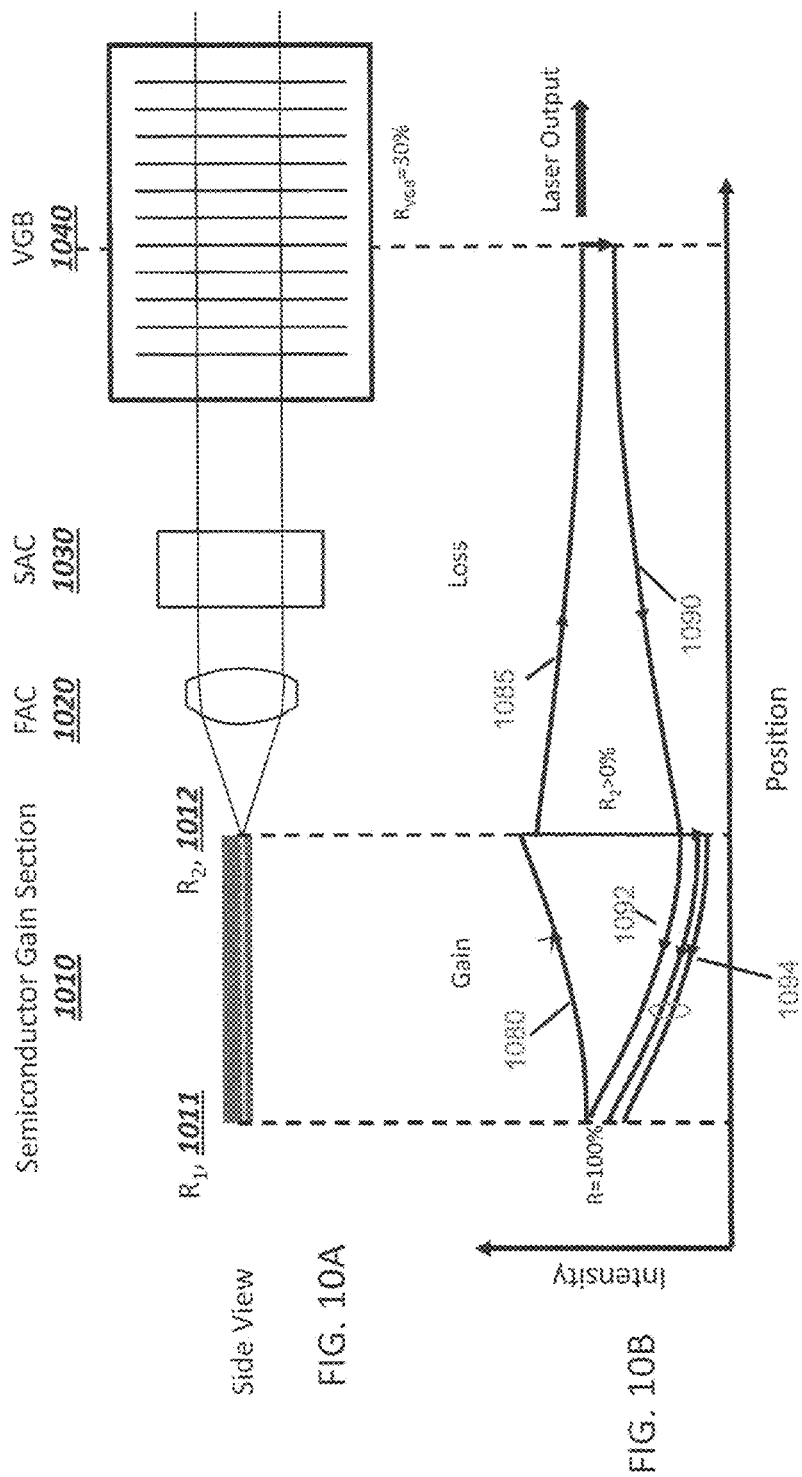
FIGS. 10A and 10B illustrate an exemplary round trip gain analysis for an HECL device with $R_2 > 0$ in accordance with the principles of the invention.

In a preferred embodiment of the invention with a finite reflectivity of the front facet of the gain section $R_2$, the reflection $R_2$ must be included in the round trip intensity calculation. When the resonant peaks of the two cavities are substantially coincident, the reflected fields can sum. Thus, leading to lasing with optimum mode selectivity and stability. The propagating intensity for finite front facet reflectivity, $R_2$, is schematically depicted in FIGS. 10A and 10B. FIG. 10A is a side view of an HECL, similar to that shown in FIG. 1A. FIG. 10B illustrates an exemplary light intensity showing an increase in intensity of the initial non-lasing light emission 1080 of the semiconductor gain material. The output of the non-lasing light emission 1085 to the VBG 1040 and the reflected light 1090 from the VBG back to the gain material. Also shown is the reflected light 1090 is amplified in the gain material (1092) and the reflected light 1094 of the initial light 1080. The combination of the reflected light 1092 and 1094 contribute to cause a lasing output at a desired wavelength.

By summing up the fields, the threshold modal gain can be calculated to be $$G_{th} = -(\tfrac{1}{2}L_g)^* \ln(R_2 + (1-R_2)^{2*} R_{VBG})$$

Figure 11:
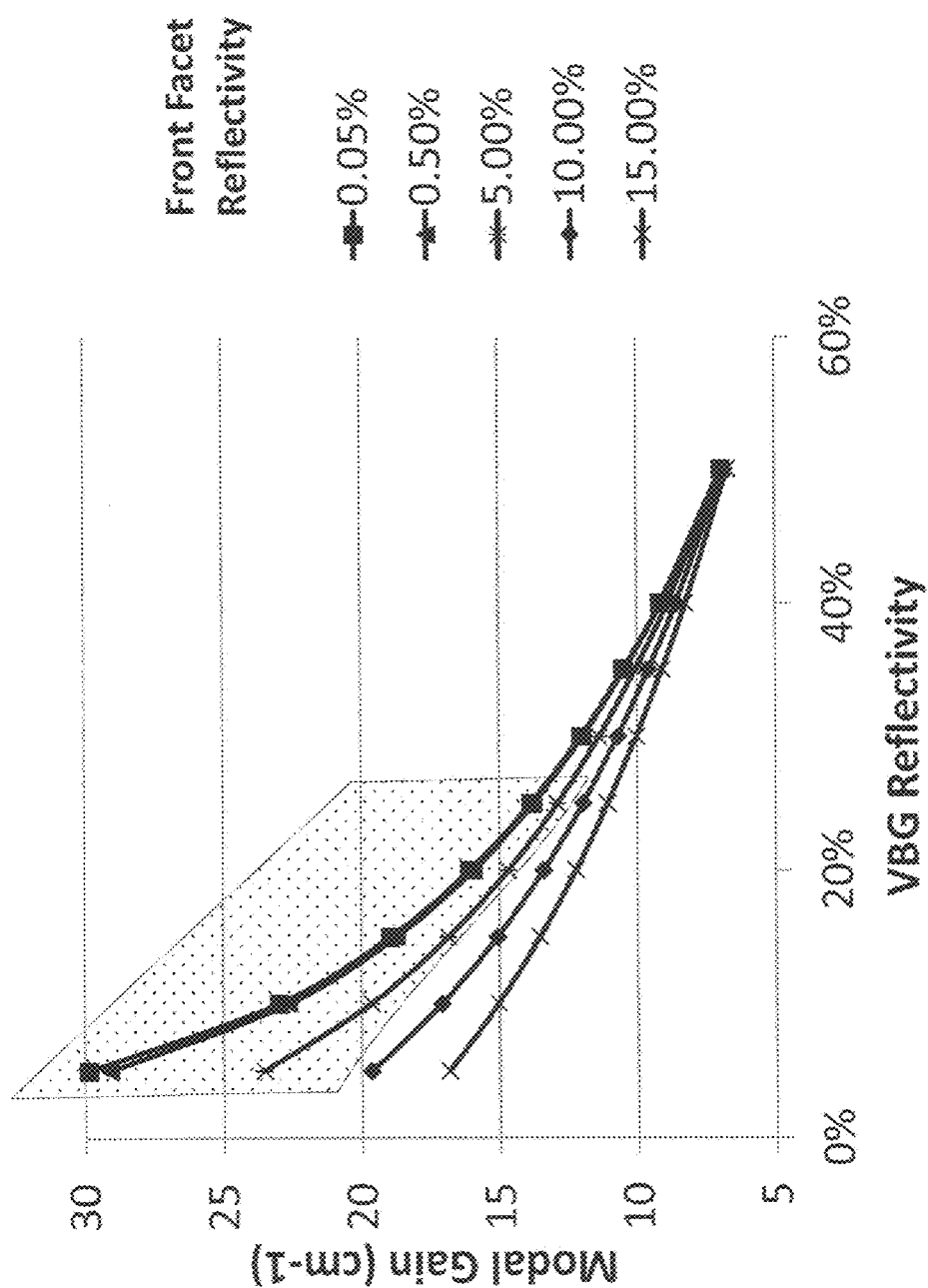
FIG. 11 illustrates a plot of threshold modal gain vs. VBG reflectivity with front facet reflectivity $R_2$ as a parameter in accordance with the principles of the invention.

This calculation can be applied advantageously to determine the optimum reflectivities for stable operation of the HECL. A particularly illustrative example is shown in FIG. 11 where the threshold gain is plotted vs. the reflectivity $R_{VBG}$ of the VBG, using the front facet reflectivity $R_2$ as a parameter. The nominal length of the semiconductor gain section is taken to be 0.5 mm for this exemplary example (in order to prevent lasing), but may have different values as determined by the desirable operating parameters of the device. A desirable operating region is depicted as a shaded region shown in FIG. 11.

Thus in an embodiment of the invention, the semiconductor gain section may have front facet reflectivity $R_2 > 0.5\%$, while preventing lasing of the gain section without additional feedback from the VBG. Non-lasing gains section may be achieved by decreasing the length of the semiconductor gain section, as shown in the analysis of the round trip gain of the device, previously presented. In another aspect of the invention altering the epitaxial layer structure of the semiconductor gain section may be used to prevent lasing of the gain section.

Additionally, as the front facet reflectivity increases, the effect of the feedback from the VBG is reduced as more of the grating feedback is reflected by the front facet. In conjunction with the fact that the semiconductor gain section is more likely to lase on its own at higher front facet reflectivity, it is thus desirable to limit the value of $R_2$ preferably to a value $<5\%$.

Also from the plots of FIG. 11, it may be seen that the effect of $R_{VBG}$ on the modal gain increases for $R_{VBG} < 30\%$. This effect, however, comes at the cost of higher modal gain but also results in more coupled output power. As the VBG reflectivity is well defined, this is a desirable attribute as the narrow linewidth operation of the HECL device should be predominantly controlled by feedback from the VBG which has a narrow spectral linewidth. Specifically, as the reflectivity from the grating is decreased for wavelengths different from its peak wavelength, the required modal gain increases rapidly and, thus, emissions not at the peak wavelength are strongly suppressed. This leads to enhanced wavelength stability of the HECL device.

Thus, as schematically depicted by the shaded region in FIG. 11, a desirable operating regime for stable single wavelength operation may be defined as $R_{VBG} = 5$-$30\%$ and $R_2 = 0.05$-$5\%$. Within this region of stable wavelength operation, the designer may choose appropriate combinations of VBG reflectivity and front facet reflectivity (at a desired gain section length) to yield higher powers or lower threshold currents. For example, the coupled output power of the device increases as the reflectivity of the VBG decreases, leading to higher output power even as the effect of the Bragg grating on wavelength stability increases. But, this operating regime does require more gain from the semiconductor gain section and, hence, leads to a higher threshold current. As seen in FIG. 11, for a gain section length of 0.5 mm and reflectivities $R_2$ approximately 0.5% and $R_{VBG}$ approximately 5%, the required threshold modal gains can approach 30 cm$^{-1}$. As this can correspond to QW gains of the order of 3000 cm$^{-1}$, careful design of the QW structure of the semiconductor gain section is required for proper operation of the device. Thus in accordance with the principles of the invention, the reflectivity of the front facet may be chosen in conjunction with the length of the semiconductor gain chip and the reflectivity of the VBG, to achieve desired performance parameters from the device, e.g., stable single mode device with high output power.

Alternatively, the VBG reflectivity and front facet reflectivity may be chosen to have higher values for reduced threshold current. For example, for reflectivities $R_2$ approximately 10% and $R_{VBG}$ approximately 20%, the required modal gain at threshold is only 12 cm$^{-1}$; a substantial reduction from the high power output embodiment. A device such as this would have substantially reduced threshold current but would not necessarily exhibit good wavelength stability at high output powers. However, in some applications, such as operation as a seed laser for an optical amplifier where only low power is required, lower lasing threshold may be a desirable attribute.

In another embodiment of the invention, the expression for threshold gain in a device with shorter lengths of the semiconductor gain structure, the required gain can increase rapidly. Thus, shorter devices require more reflectivity from the front facet and the VBG. Increased front facet reflectivity increases the gain section finesses, which aids in mode selection and leads to narrower linewidth operation of the HECL device, but at lower powers.

In yet another alternative embodiment of the invention, for higher power operation of the HECL device, it is desirable to increase the length of the semiconductor gain section to minimize thermal effects. For example, maximum optical power increases of almost 2× (i.e., double) have been observed for cavity length increases from 2 mm to 3 mm in external cavity devices. (see, e.g., E. Kotelnikov et al, Proc. of SPIE Vol. 8277, 2012). For those longer cavity lengths, the front facet reflectivity would preferentially be reduced to prevent lasing of the gain section without feedback from the VBG. A threshold gain analysis similar to that used to generate FIG. 11, but with a cavity length of 3 mm, suggests that using front facet reflectivities in the range of $0 < R_2 < 0.5\%$ would have minimal effect on the threshold gain of the HECL device. Thus, lasing of the gain section may still be suppressed and the wavelength stabilization benefits of the multi-cavity approach may still be maintained, even for the long gain section lengths indicated for high power operation.

The overall modal gain of the semiconductor gain section may also be controlled by reducing the reflectivity of the rear facet of the semiconductor gain section. This also reduces the overall gain of the HECL cavity and may be used in conjunction with increased reflectivity of the VBG to achieve narrow linewidth operation. Alternatively, a second VBG (not shown) may be utilized at the rear of the semiconductor gain section to provide additional linewidth selectivity.

Thus, in accordance with the principles of the invention a method for designing HECL devices with different but desirable operating attributes while still maintaining good wavelength stability has been disclosed.

Experimental results confirm that lasers conforming to the above configuration principles will emit laser light in a stable, single-longitudinal mode when the key components of the HECL (see e.g., FIG. 7), the semiconductor gain section, 710, and the VBG element, 740, are controlled at a temperature that allows the VBG reflection profile to coincide with a desired one of the allowed cavity modes. The controlling temperature is maintained in a stable environment for long-term stable operation of the HECL.

An exemplary application of wavelength-stabilized laser presented herein is coherent laser radar ("LIDAR"), in which short pulses of light are reflected by distant objects. The reflected signals are coherently detected using a local oscillator in a heterodyne receiver. The pulses must be short in duration (e.g., 2 ns pulse widths are common) allowing axial resolution of approximately 0.6 m. The stability of the wavelength of the emitted pulse of light must be of the order of $10^{-9}$ to achieve the required level of coherence.

Figure 12:
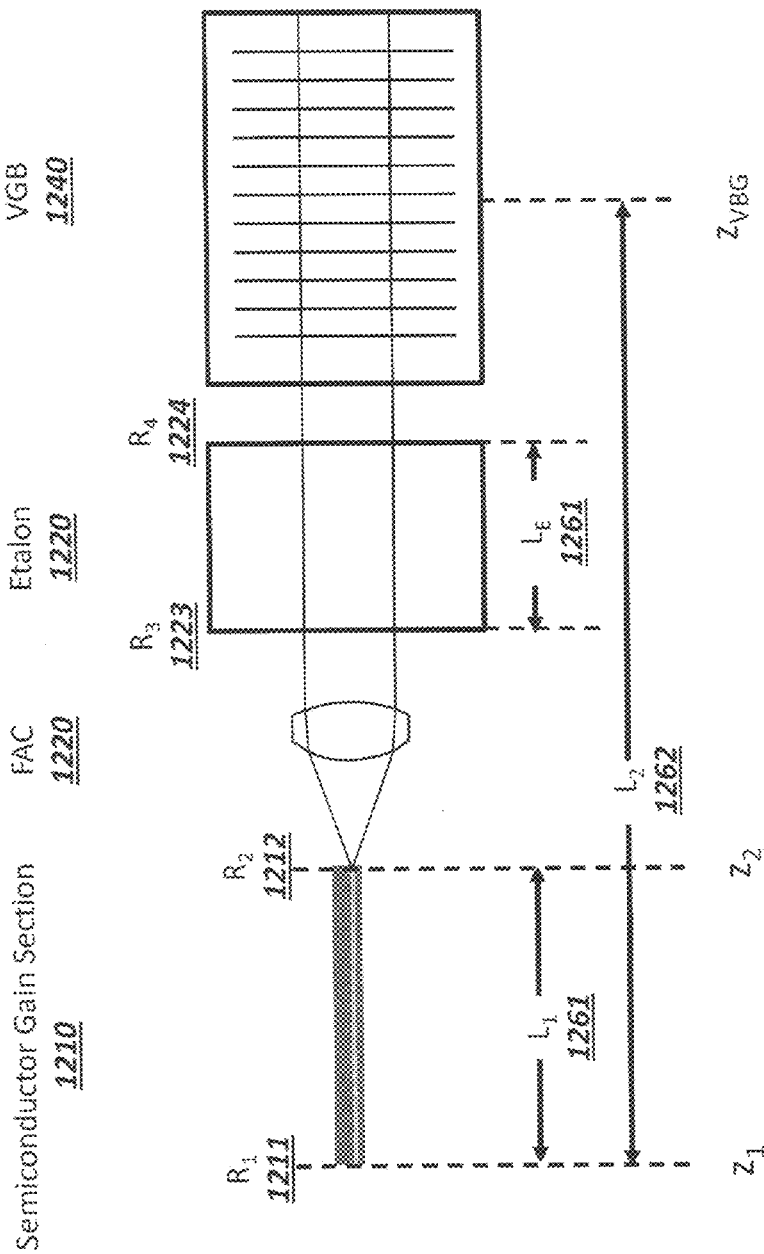
FIG. 12 illustrates an exemplary embodiment of a HECL incorporating an etalon element in accordance with the principles of the invention.

FIG. 12 is a schematic depiction of another embodiment of a HECL incorporating a discrete etalon element. Only a side view of the device is shown in FIG. 12. Also, the slow-axis corrector (SAC) is not shown in this figure (and may be assumed to be on the output side of the VBG element, 1240). The etalon is tilted slightly with respect to the collimated optical emission (not seen in this side view) to prevent reflections (1223, 1224) from the etalon surface from being reflected back into the active region of the semiconductor gain section 1210. The tilt of the etalon is sufficiently small that the optical path through the tilted etalon is substantially the same as if the etalon was oriented perpendicular to the collimated optical emission.

The etalon 1220 acts as a transmission filter for the reflected portion of the light from the VBG 1240. As the etalon 1220 presents sharp transmission peaks due to the Fabry-Perot resonances, the etalon 1220 acts as a narrow line filter and overlap of its resonances with the other resonances in the HECL cavity further improves wavelength selection and stability of the device.

The thickness, $L_E$, 1261, and refractive index of the discrete etalon 1220 may be selected to provide free-spectral range that is incommensurate with the free-spectral range of the HECL cavity. The characteristics of the discrete etalon 1220 may also be chosen to be incommensurate with the free spectral range of the semiconductor gain section, 1210, if the front-facet reflectivity, $R_2$, 1212, is sufficiently high to create a semiconductor gain section cavity that could act as a selection mechanism for allowed lasing modes.

Table 3 shows the free spectral range of an exemplary discrete etalon comprised of BK7 glass. Any other substantially transparent optical material would work, as well, as well as Fabry-Perot cavities comprised of two reflective surfaces separated by a distance, e.g., in air or vacuum.

TABLE 3

| $L_E$ (mm) | $\Delta\lambda_E$ (pm) | $\Delta\nu_E$ (GHz) |
| --- | --- | --- |
| 0.5 | 754 | 200 |
| 1.0 | 277 | 100 |
| 2.0 | 189 | 50 |
| 3.0 | 126 | 33 |

Figure 13:
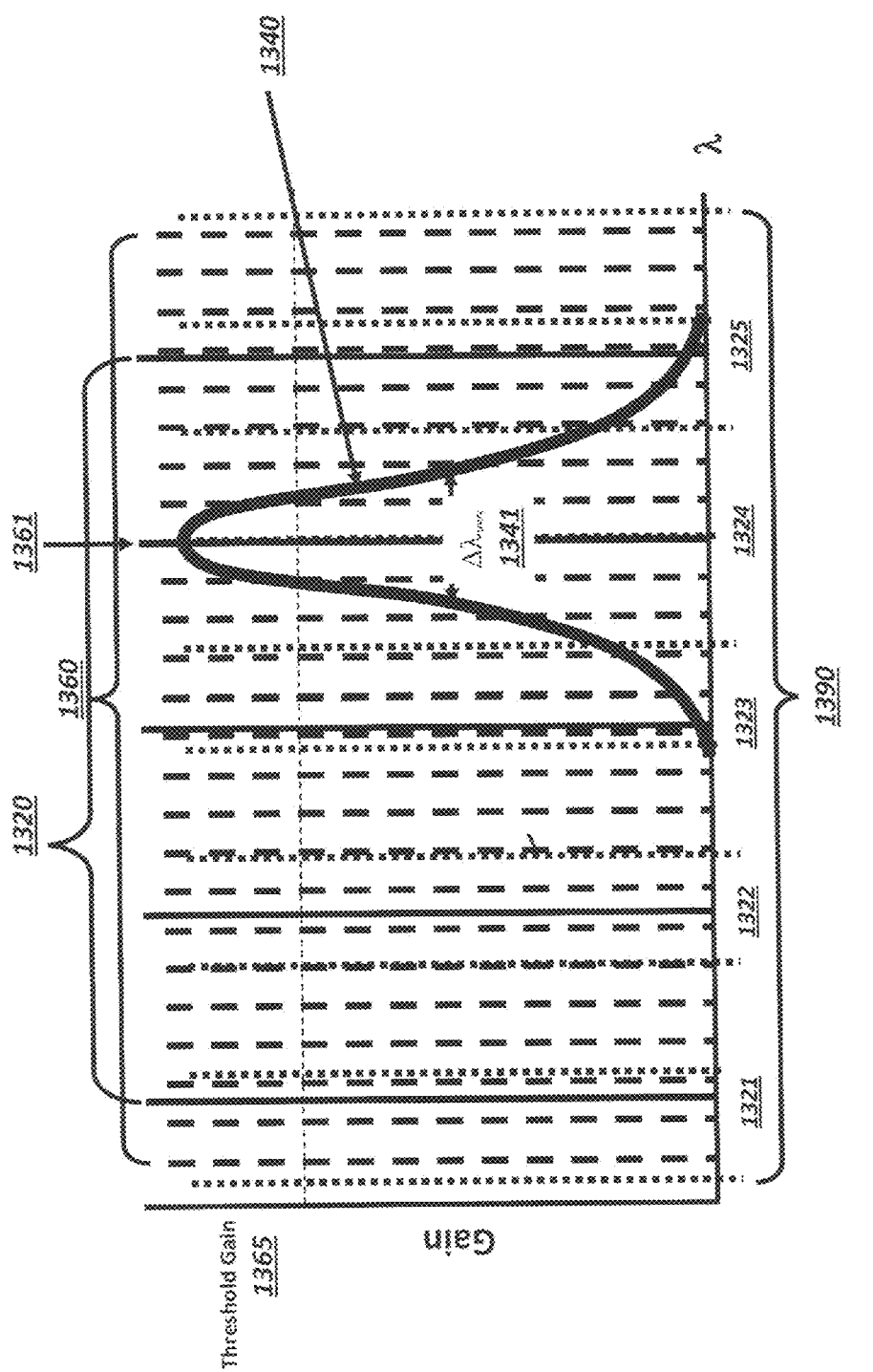
FIG. 13 illustrates an exemplary superposition of cavity modes allowed by the VBG cavity, a semiconductor gain section cavity and a discrete etalon.

Selecting, for example, an etalon thickness of 2.0 mm, the allowed modes of a HECL that comprises a subset of cavity modes, 1320, separated in wavelength by 189 pm as shown in FIG. 13.

FIG. 13 illustrates the superposition of the resonant cavity modes allowed by the VBG 1240 and gain sections 1210 as well as the transmission function of the discrete etalon 1220. Discrete etalon modes are shown at wavelengths 1321, 1322, 1323, 1324, and 1325 as solid vertical lines. The subsets of allowed HECL cavity modes, 1360 are shown as dashed vertical lines, and semiconductor gain section modes, 1390, are shown as dotted vertical lines, as is the reflection profile of the VBG element, 1340. FIG. 13 illustrates the case where only discrete etalon mode 1324 sufficiently coincides with one of the HECL cavity modes, 1360 and semiconductor gain section modes, 1390, while also being allowed by the reflection profile of the VBG, 1340. Thus, laser oscillation can only occur at the mode 1361, i.e., at wavelength 1324.

The wavelengths of the subsets of allowed cavity modes, 1320, 1360, and/or 1390, and/or the position of the reflection profile of the VBG element, 1340, may be shifted individually or in groups by temperature tuning. Thus, the selection of a desired lasing wavelength may be based on a temperature of operation of one or more of the disclosed elements.

The reflectivity of the coatings applied to the front- and rear-surfaces of the discrete etalon, $R_3$ and $R_4$, respectively (1223 and 1224, respectively, of FIG. 12) may be selected to optimize wavelength stability and output power.

Figure 14:
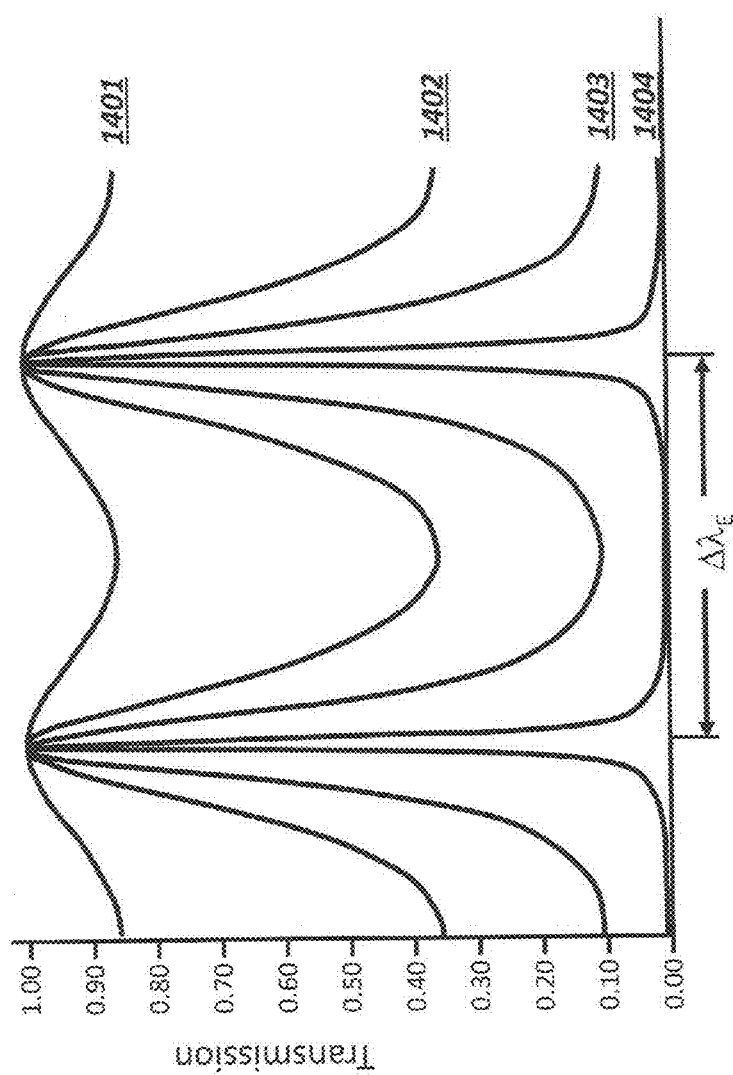
FIG. 14 illustrates a transmission profiles for a BK7 etalon, 2 mm-thick, operating at 1.064 µm in accordance with the principles of the invention.

FIG. 14 shows the transmission profile of an exemplary 2 mm-thick etalon made of BK7 glass operating at 1.064 μm. Four exemplary transmission curves are shown: 1401 is the transmission profile for $R_3=R_4=4\%$; 1402 is the transmission profile for $R_3=R_4=25\%$; 1403 is the transmission profile for $R_3=R=50\%$; and 1404 is the transmission profile for $R_3=R_4=90\%$. The free spectral range $\Delta\lambda E=189$ pm in all cases, determined by the thickness of the discrete etalon, the refractive index of BK7 glass, and the wavelength of light.

Although FIG. 14 represents transmission profiles that are equal, it would be recognized that $R_3$ and $R_4$ do not have to be the same value. The effective reflectivity of a Fabry-Perot etalon is a function of $(R_3 R_4)^{1/2}$.

The reflection-limited finesses of above cavities are: 0.9, 2.1, 4.4, and 29.8, for profiles 1401, 1402, 1403, and 1404, respectively. In practice, roughness of the reflective surfaces and inaccuracies in parallelism of those surfaces will reduce the peak transmission from 100%, with greater effects for high-finesse cavities. In particular, the peak transmissions for the above cases are approximately 99.95%, 99.7%, 98.7%, and 68.0%, respectively. The tradeoff between transmission loss and wavelength selectivity due to relatively narrow pass bands imparted by high-reflectivity discrete etalons and high transmission with relatively poorer wavelength selectivity imparted by low-reflectivity discrete etalons suggests that coating having a reflectivity in the range of 10 to 75% may be most appropriate for HECL configurations incorporating a discrete etalon.

As previously described tuning of the center wavelength of the VBG reflection profile may be achieved, for example, by varying its temperature. Tuning of the coincidences between allowed HECL cavity modes, allowed discrete etalon modes, and the reflection profile of the VBG element may be accomplished by selecting the temperature at which the VBG and/or semiconductor gain section operate. Also, tuning of the HECL cavity modes may be accomplished by changing the position of the VBG element with respect to the rear-facet reflector of the diode laser gain chip, as described earlier with respect to the embodiments of the invention that do not incorporate a discrete etalon.

Thus, in accordance with the principles of the invention, the laser radiation is only emitted when a sum of the reflected portion of the collected and collimated plurality of known emission wavelengths from the VBG and the portion of the collected and collimated plurality of known emission wavelengths reflected by the front facet provides sufficient feedback to support laser emission. In addition, reflected portion from the VBG is insufficient for the device to emit laser radiation without reflection from the front facet. Similarly, the reflected emission from the front facet is insufficient for the device to emit laser radiation without the reflected portion from the VBG. Furthermore, the length of the semiconductor gain section is chosen to provide sufficient gain to support laser emission while providing resonant modes with different spacing than the resonant modes of the resonant cavity formed by the rear reflector and VBG.

As used herein, the terms "comprises", "comprising", "includes", "including", "has", "having", or any other variation thereof, are intended to cover non-exclusive inclusions. For example, a process, method, article or apparatus that comprises a list of elements is not necessarily limited to only those elements but may include other elements not expressly listed or inherent to such process, method, article, or apparatus. In addition, unless expressly stated to the contrary, the term "of" refers to an inclusive "or" and not to an exclusive "or". For example, a condition A or B is satisfied by any one of the following: A is true (or present) and B is false (or not present); A is false (or not present) and B is true (or present); and both A and B are true (or present).

The terms "a" or "an" as used herein are to describe elements and components of the invention. This is done for convenience to the reader and to provide a general sense of the invention. The use of these terms in the description herein should be read and understood to include one or at least one. In addition, the singular also includes the plural unless indicated to the contrary. For example, reference to a composition containing "a compound" includes one or more compounds. As used in this specification and the appended claims, the term "or" is generally employed in its sense including "and/or" unless the content clearly dictates otherwise.

All numeric values are herein assumed to be modified by the term "about," whether or not explicitly indicated. The term "about" generally refers to a range of numbers that one of skill in the art would consider equivalent to the recited value (i.e., having the same function or result). In any instances, the terms "about" may include numbers that are rounded (or lowered) to the nearest significant figure.

The invention has been described with reference to specific embodiments. One of ordinary skill in the art, however, appreciates that various modifications and changes can be made without departing from the scope of the invention as set forth in the claims. Accordingly, the specification is to be regarded in an illustrative manner, rather than with a restrictive view, and all such modifications are intended to be included within the scope of the invention.

Benefits, other advantages, and solutions to problems have been described above with regard to specific embodiments. The benefits, advantages, and solutions to problems, and any element(s) that may cause any benefits, advantages, or solutions to occur or become more pronounced, are not to be construed as a critical, required, or an essential feature or element of any or all of the claims.

It is expressly intended that all combinations of those elements that perform substantially the same function in substantially the same way to achieve the same results are within the scope of the invention. Substitutions of elements from one described embodiment to another are also fully intended and contemplated.

What is claimed is:

1. A device for generating a laser emission having a stable wavelength, the device comprising:
   a semiconductor gain section having a light emission of a known non-lasing peak wavelength and a known spectral width, said semiconductor gain section comprising:
   a rear facet having a first reflectivity; and
   a front facet having a second reflectivity, said rear facet and said front facet forming a first resonant cavity having a first plurality of resonances within the spectral width of the light emission of said semiconductor gain section,
   an optics section collecting and collimating said light emission;
   a volume Bragg grating, having a known reflectivity, said volume Bragg grating:
   receiving said collected and collimated light emission, and
   reflecting a portion of the received collected and collimated light emission back into the semiconductor gain section, wherein the rear facet of the semiconductor gain section and the volume Bragg grating form a second resonant cavity with a second plurality of resonant wavelengths, and
   a discrete etalon element positioned between said semiconductor gain section and said volume Bragg grating, said etalon element comprising:
   a front optical surface; and
   a rear optical surface, each of said front and rear optical surfaces coated with partially reflective coatings, said reflective coatings determining allowed resonances of the discrete etalon;
   wherein one of said first plurality of resonances, one of said second plurality of resonant wavelengths and one of said allowed resonances is substantially coincident and said laser emission is emitted at said substantially coincident wavelength when a sum of a reflected portion of the collected and collimated light emission from the volume Bragg grating and a reflected portion of the light emission reflected by the front facet provide sufficient feedback to support the laser emission.

2. The device of claim 1 wherein the reflected portion from the volume Bragg grating is less than 30% at said laser emission.

3. The device of claim 1 wherein the reflectivity of the front facet is in the range from 0.1-10.0% at said laser emission.

4. The device of claim 1 wherein the reflectivity of the rear facet is selected to suppress said laser emission in the absence of reflected emission from both of the volume Bragg grating and the front facet.

5. The device of claim 1 wherein the rear facet has a reflectivity of at least 80% at the laser emission.

6. The device of claim 1 wherein the rear facet is coated with a low reflectivity coating.

7. The device of claim 6 further comprising:
   a second volume Bragg grating in optical communication with said rear facet.

8. The device of claim 1, wherein said first and second reflectivity of said semiconductor gain section and a length of the semiconductor gain section are selected to inhibit lasing operation of said semiconductor gain section.

9. The device of claim 1, wherein the length of the semiconductor gain section is in the range of 0.2-2.0 mm (millimeters).

10. The device of claim 1, wherein a unit gain of the semiconductor gain section is increased by at least one of: increasing a number of quantum wells and employing quantum wells with tensile or compressive strain.

11. The device of claim 1, wherein a free spectral range of the second resonant cavity formed by the volume Bragg grating and rear reflector is between 3 GHz and 30 GHz.

12. The device of claim 1 wherein a free spectral range of the first resonant cavity formed by the semiconductor gain section is between 5 GHz and 500 GHz.

13. The device of claim 1 wherein the free spectral range of the first resonant cavity is twice the free spectral range of the second resonant cavity.

14. The device of claim 1, wherein the etalon is tilted with respect to the laser emission.

15. The device of claim 1, wherein the etalon is tilted with respect to the laser emission at an angle of 0.5-5.0 degrees.

16. The device of claim 1 wherein wavelengths of the laser emission are between about 375 nm and about 3 μm.

17. The device of claim 1, wherein the etalon element comprise:
   a solid transparent material having substantially parallel front and rear optical surfaces.

18. The device of claim 1, wherein the front and rear optical surfaces of the discrete etalon are each coated to reflect between approximately 10% and 99% said laser emission.

* * * * *